US012686943B2

(12) United States Patent
Vogel et al.

(10) Patent No.: US 12,686,943 B2
(45) Date of Patent: Jul. 21, 2026

(54) CRYSTAL STRUCTURE ORIENTATION IN SEMICONDUCTOR SEMI-FINISHED PRODUCTS AND SEMICONDUCTOR SUBSTRATES FOR FISSURE REDUCTION AND METHOD OF SETTING SAME

(71) Applicant: SICRYSTAL GMBH, Nuremberg (DE)

(72) Inventors: Michael Vogel, Nuremberg (DE); Erwin Schmitt, Grossenseebach (DE); Arnd-Dietrich Weber, Forchheim (DE); Ralph-Uwe Barz, Erlangen (DE); Dominik Bannspach, Erlangen (DE)

(73) Assignee: SICRYSTAL GMBH, Nuremberg (DE)

( * ) Notice: Subject to any disclaimer, the term of this patent is extended or adjusted under 35 U.S.C. 154(b) by 325 days.

(21) Appl. No.: 18/016,912

(22) PCT Filed: Jun. 9, 2021

(86) PCT No.: PCT/EP2021/065505
§ 371 (c)(1),
(2) Date: Jan. 19, 2023

(87) PCT Pub. No.: WO2022/017677
PCT Pub. Date: Jan. 27, 2022

(65) Prior Publication Data
US 2023/0349071 A1     Nov. 2, 2023

(30) Foreign Application Priority Data
Jul. 21, 2020     (DE) ..................... 10 2020 209 092.0

(51) Int. Cl.
*C30B 29/06* (2006.01)
*C30B 33/00* (2006.01)
(Continued)

(52) U.S. Cl.
CPC .............. *C30B 29/06* (2013.01); *C30B 33/00* (2013.01); *C30B 29/40* (2013.01); *C30B 29/48* (2013.01);
(Continued)

(58) Field of Classification Search
None
See application file for complete search history.

(56) References Cited

U.S. PATENT DOCUMENTS 3,821,783 A * 6/1974 Sugita .................. H10D 62/405
257/E21.123
5,279,077 A * 1/1994 Miyashita ............ B28D 5/0011
451/53
(Continued)

FOREIGN PATENT DOCUMENTS

BY          6340 U   *   6/2010
BY          6341 U   *   6/2010
(Continued)

OTHER PUBLICATIONS

Machine Translation of JP2002273647A, Sep. 2002 (Year: 2002).*
(Continued)

*Primary Examiner* — Jeffrey A Vonch
(74) *Attorney, Agent, or Firm* — Michael Best & Friedrich LLP

(57) ABSTRACT
Crystal structure orientation in semiconductor semi-finished products and semiconductor substrates for fissure reduction and method of setting same The present invention provides monocrystalline semiconductor semi-finished product and substrates having a predetermined orientation of its crystal structure relative to a central axis and a at least partially curved lateral surface of the semi-finished product or substrate that reduces or even eliminates the occurrence of cracks during mechanical processing, and a method of
(Continued)

producing such semiconductor semi-finished products and/ or substrates. In the predetermined orientation, a first crystallographic axis perpendicular to a set of first cleavage planes makes a first tilt angle with a plane transverse to the central axis, and a second crystallographic axis perpendicular to a set of second cleavage planes and to the first crystallographic axis makes a second tilt angle with said plane transverse to the central axis so that each set of parallel cleavage planes that are symmetrically equivalent to either the first or second cleavage planes are inclined relative to the central axis.

10 Claims, 10 Drawing Sheets

(51) Int. Cl.

| | |
|---|---|
| C30B 29/40 | (2006.01) |
| C30B 29/48 | (2006.01) |
| H10D 62/40 | (2025.01) |
| H10D 62/83 | (2025.01) |
| H10F 71/00 | (2025.01) |
| H10P 14/20 | (2026.01) |

(52) U.S. Cl.
CPC ........... *H10D 62/405* (2025.01); *H10D 62/83* (2025.01); *H10F 71/1224* (2025.01); *H10P 14/2905* (2026.01); *H10P 14/2926* (2026.01); *Y02E 10/547* (2013.01)

(56) References Cited

U.S. PATENT DOCUMENTS

| | | | | |
|---|---|---|---|---|
| 5,720,271 | A | * | 2/1998 | Hauser ................. B28D 5/0088 125/16.02 |
| 5,838,058 | A | * | 11/1998 | Kitajima ............... H10P 30/222 257/E21.345 |
| 5,875,769 | A | * | 3/1999 | Toyama ................. B28D 5/045 125/16.02 |
| 6,869,480 | B1 | | 3/2005 | Abel et al. |
| 8,865,324 | B2 | | 10/2014 | Straubinger et al. |
| 12,195,878 | B2 | | 1/2025 | Vogel et al. |
| 2003/0160304 | A1 | * | 8/2003 | Ohmi ............... H10D 64/01346 257/628 |
| 2004/0032003 | A1 | * | 2/2004 | Ohmi ................... H10D 64/693 257/288 |
| 2004/0055634 | A1 | * | 3/2004 | Yamaguchi .......... B28D 5/0011 83/14 |
| 2004/0118338 | A1 | * | 6/2004 | Hammer ................. C30B 33/00 117/63 |
| 2004/0168682 | A1 | * | 9/2004 | Hammer .............. B28D 5/0088 125/16.01 |
| 2005/0035349 | A1 | * | 2/2005 | Umeno ................... C30B 29/06 257/E21.119 |
| 2005/0160965 | A1 | * | 7/2005 | Ohtani ................. C30B 23/005 117/911 |
| 2005/0211156 | A1 | * | 9/2005 | Gunjishima ............ C30B 23/00 117/2 |
| 2005/0229840 | A1 | * | 10/2005 | Iida ......................... C30B 29/06 117/13 |
| 2006/0068568 | A1 | * | 3/2006 | Yanase ................. H10P 14/2926 257/E21.129 |
| 2006/0131553 | A1 | * | 6/2006 | Yamanaka ....... H10D 64/01336 257/E21.244 |
| 2006/0174820 | A1 | * | 8/2006 | Yoshizawa .............. C30B 29/06 117/49 |
| 2006/0246689 | A1 | * | 11/2006 | Takano ............... H10P 90/1914 438/459 |
| 2006/0281283 | A1 | * | 12/2006 | Yoshida .................. C30B 29/06 438/478 |
| 2008/0053368 | A1 | * | 3/2008 | Inami ..................... C30B 15/36 117/19 |
| 2008/0057323 | A1 | * | 3/2008 | Dohi ..................... H10P 14/20 257/E21.123 |
| 2008/0213536 | A1 | | 9/2008 | Maruyama et al. |
| 2008/0318496 | A1 | * | 12/2008 | Tanikella .................. B24B 7/22 451/41 |
| 2009/0056513 | A1 | * | 3/2009 | Baer ...................... B28D 1/221 83/72 |
| 2009/0084373 | A1 | * | 4/2009 | Oishi ..................... B28D 5/045 125/20 |
| 2009/0274962 | A1 | * | 11/2009 | Kubota .................. B82Y 10/00 430/5 |
| 2009/0283761 | A1 | * | 11/2009 | Hammer ................. H10P 54/00 423/625 |
| 2009/0304994 | A1 | * | 12/2009 | Daub ..................... C30B 25/02 428/141 |
| 2010/0025909 | A1 | * | 2/2010 | Ono .......................... C30B 25/12 269/104 |
| 2010/0216375 | A1 | * | 8/2010 | Kaito ......................... B24B 5/50 451/63 |
| 2010/0307403 | A1 | * | 12/2010 | Shen ........................ C30B 29/06 117/15 |
| 2011/0031592 | A1 | * | 2/2011 | Ishibashi .............. H10P 52/402 257/E29.004 |
| 2011/0086213 | A1 | | 4/2011 | Straubinger et al. |
| 2011/0210342 | A1 | | 9/2011 | Sasaki et al. |
| 2011/0297223 | A1 | * | 12/2011 | Krause ............... H10F 71/1221 117/63 |
| 2012/0070605 | A1 | | 3/2012 | Sasaki et al. |
| 2012/0326268 | A1 | * | 12/2012 | Kato ................. H01L 21/02381 438/455 |
| 2013/0037920 | A1 | * | 2/2013 | Shiga .................. H10P 14/3411 257/E29.004 |
| 2014/0054636 | A1 | | 2/2014 | Anzue et al. |
| 2014/0106540 | A1 | * | 4/2014 | Henley .................. C30B 29/06 438/458 |
| 2015/0275395 | A1 | * | 10/2015 | Kang ...................... C30B 25/12 118/728 |
| 2016/0118257 | A1 | | 4/2016 | Kaneko et al. |
| 2016/0233293 | A1 | * | 8/2016 | Thapa .................... C30B 25/18 |
| 2016/0326668 | A1 | | 11/2016 | Nishiguchi et al. |
| 2017/0275779 | A1 | | 9/2017 | Nishiguchi et al. |
| 2018/0223447 | A1 | * | 8/2018 | Noguchi ............ C23C 16/0281 |
| 2019/0103267 | A1 | | 4/2019 | Chen et al. |
| 2019/0267239 | A1 | * | 8/2019 | Ohtsuki .............. H10D 62/405 |
| 2019/0348272 | A1 | | 11/2019 | Ecker et al. |
| 2020/0043728 | A1 | * | 2/2020 | Lee ...................... H10D 62/405 |
| 2020/0051831 | A1 | * | 2/2020 | Beyer ................... C30B 29/36 |
| 2020/0066592 | A1 | * | 2/2020 | Seddon .................. H10P 54/00 |
| 2021/0060818 | A1 | * | 3/2021 | Matsumoto ....... H01L 21/02378 |
| 2022/0025545 | A1 | | 1/2022 | Vogel et al. |

FOREIGN PATENT DOCUMENTS

| | | | | | |
|---|---|---|---|---|---|
| CN | 101536157 | A | | 9/2009 | |
| CN | 102002753 | A | * | 4/2011 | |
| CN | 102104058 | A | * | 6/2011 | |
| CN | 103862584 | A | * | 6/2014 | |
| CN | 109080012 | A | * | 12/2018 | .............. B28D 5/00 |
| CN | 110067020 | A | | 7/2019 | |
| CN | 110341061 | A | * | 10/2019 | ........... B28D 5/0058 |
| DE | 10006108 | A1 | * | 8/2001 | ............. C30B 25/18 |
| DE | 102011076860 | A1 | * | 12/2012 | ............. C30B 29/06 |
| DE | 102012203706 | A1 | * | 8/2013 | ............. C30B 28/06 |
| DE | 102012216740 | A1 | * | 3/2014 | .......... H10F 71/121 |
| GB | 2357901 | A | * | 7/2001 | .......... H10D 10/421 |
| JP | 62226891 | A | * | 10/1987 | |
| JP | 0361634 | B2 | * | 9/1991 | |
| JP | 050347256 | A | * | 12/1993 | |
| JP | 07047541 | A | * | 2/1995 | |
| JP | 08026891 | A | * | 1/1996 | |
| JP | H0826891 | A | * | 1/1996 | |
| JP | H08139027 | A | * | 5/1996 | |
| JP | H09278595 | A | | 10/1997 | |
| JP | 11037958 | A | * | 2/1999 | |
| JP | 2002273647 | A | * | 9/2002 | |
| JP | 2003086834 | A | * | 3/2003 | |
| JP | 2005014241 | A | * | 1/2005 | |

(56) References Cited

FOREIGN PATENT DOCUMENTS

| | | | | | |
|----|-----------------|----|----|---------|-----------------|
| JP | 2005039111 | A | * | 2/2005 | |
| JP | 2005217236 | A | * | 8/2005 | |
| JP | 2006137632 | A | * | 6/2006 | |
| JP | 2007070131 | A | * | 3/2007 | |
| JP | 2007080971 | A | | 3/2007 | |
| JP | 2007201015 | A | * | 8/2007 | |
| JP | 2008098412 | A | | 4/2008 | |
| JP | 2008109011 | A | * | 5/2008 | |
| JP | 2008159667 | A | * | 7/2008 | |
| JP | 2008246833 | A | * | 10/2008 | |
| JP | 2009004691 | A | * | 1/2009 | |
| JP | 2009018983 | A | | 1/2009 | |
| JP | 2011119412 | A | | 6/2011 | |
| JP | 2011157231 | A | | 8/2011 | |
| JP | 2012229158 | A | * | 11/2012 | ............. C30B 15/36 |
| JP | 2013049609 | A | | 3/2013 | |
| JP | 2013083544 | A | * | 5/2013 | |
| JP | 2014194352 | A | | 10/2014 | |
| JP | 2015002218 | A | | 1/2015 | |
| JP | 2015032771 | A | * | 2/2015 | |
| JP | 2017105697 | A | | 6/2017 | |
| JP | 2017145150 | A | | 8/2017 | |
| JP | 2017152423 | A | | 8/2017 | |
| JP | 2017210376 | A | * | 11/2017 | |
| JP | 2018198331 | A | * | 12/2018 | |
| JP | 2019004047 | A | | 1/2019 | |
| KR | 20100043459 | A | * | 1/2010 | ......... H10P 14/2926 |
| RU | 2499324 | C2 | * | 11/2013 | |
| SU | 823147 | A1 | * | 4/1981 | |
| WO | 2004010075 | A1 | | 1/2004 | |
| WO | 2006022282 | A1 | | 3/2006 | |
| WO | 2014034080 | A1 | | 3/2014 | |
| WO | 2016017502 | A1 | | 2/2016 | |
| WO | 2020115950 | A1 | | 6/2020 | |
| WO | WO-2021111063 | A1 | * | 6/2021 | ............. H10P 90/18 |
| WO | WO-2021180248 | A1 | * | 9/2021 | ............. B28D 5/00 |

OTHER PUBLICATIONS

Machine Translation of JP2008159667A, Jul. 2008 (Year: 2008).*
Machine Translation of JP2012229158A, Nov. 2012 (Year: 2012).*
Pal et al., A New Model for the Etching Characteristics of Corners Formed by Si{111} Planes on Si{110} Wafer Surface, Nov. 2013, Engineering, vol. 5 (Year: 2013).*
Danilewsky et al., Crack propagation and fracture in silicon wafers under thermal stress, Apr. 2013, Journal of Applied Crystallography, vol. 46, pp. 849-855 (Year: 2013).*
Vaknin et al., Geometrical prediction of cleavage planes in crystal structures, Aug. 2021, IUCrJ, vol. 8 (Part 5) (Year: 2021).*
Lei et al., Die singulation technologies for advanced packaging: A critical review, Jul. 2012, Journal of Vacuum Science & Technology B Microelectronics Processing and Phenomena, vol. 30, No. 4, pp. 040801-1-27 (Year: 2012).*
Xiao et al., Effect of crystal plane orientation on tribochemical removal of monocrystalline silicon, Jan. 2017, Scientific Reports, vol. 7, No. 40750 (Year: 2017).*
Charles et al., Modification of the surface morphology of silicon(111) with growth temperature, Feb. 2013, Surface Science, vol. 608, pp. 199-203 (Year: 2013).*
Phillips et al., Observations Of {111} Atomic Planes in Silicon, Jul. 1968, Applied Physics Letters, vol. 12, No. 2 (Year: 1968).*
Rao et al., Determination of precise crystallographic directions on Si{111} wafers using self-aligning pre-etched pattern, Jun. 2018, Micro and Nano Systems Letters, vol. 6, No. 4 (Year: 2018).*
Japanese Patent Office Action for Application No. 2023-504453 dated May 7, 2024 (14 pages including English machine translation).
Korean Patent Office Action for Application No. 10-2023-7003210 dated Apr. 29, 2024 (21 pages including English summary).
International Search Report and Written Opinion for Related Application No. PCT/EP2021/065505 dated Sep. 24, 2021 (11 pages).
European Patent Office Search Report for Related Application No. 20186879 dated Nov. 25, 2020 (8 pages).

* cited by examiner

CRYSTAL STRUCTURE ORIENTATION IN SEMICONDUCTOR SEMI-FINISHED PRODUCTS AND SEMICONDUCTOR SUBSTRATES FOR FISSURE REDUCTION AND METHOD OF SETTING SAME

TECHNICAL FIELD OF THE INVENTION

The present invention relates to semiconductor single crystals having a specific orientation of its crystal structure for reducing or eliminating the occurrence of cracks or fissures during mechanical processing, and method of producing semiconductor single crystals with such orientation.

BACKGROUND OF THE INVENTION

Semiconducting substrates are commonly used in the production of electronic and optoelectronic components for a wide range of applications, such as power electronics, radio frequency and optoelectronic applications. Semiconducting substrates are generally produced from bulk semiconductor monocrystals grown by a crystal-growth process, such as physical vapour deposition (PVT), solution growth or melting phase growth, from suitable source materials. The semiconductor substrates are then obtained from the bulk semiconductor monocrystal by cutting wafers with the use of wire saws, and then refining the wafer surfaces in multi-stage polishing steps. In the subsequent epitaxy processes, thin single-crystalline layers of semiconductors materials (for e.g. SiC, GaN) are then deposited onto the semiconductor substrates. The properties of these epitaxial layers, and of the components made therefrom, depend crucially on the quality of the underlying semiconductor substrate.

The desired diameter for the substrates and one or more orientation flats (OF) are in general set on the as-grown semiconductor crystal through mechanical processes, such as grinding of the crystal lateral surface, and the front faces of the so-processed crystal cylinder are prepared for the wafer separation process (for e.g. by wire sawing). As illustrated in FIG. 1, the semiconducting semi-finished product 100 resulting from such mechanical processing is an oriented cylinder having the diameter of the future substrate wafers, one or two orientation flats 110 (or a notch) defined on the lateral cylindrical surface 130 and parallel, flat front faces 120a, 120b.

The semiconductor semi-finished product 100 is then divided into individual raw, monocrystalline semiconductor substrates, for e.g. using a wire-sawing process. After quality control, the monocrystalline semiconductor substrates undergo further mechanical processing. As an example, the following process sequence may be used. After mechanical processing of the edges, single-stage or multi-stage grinding or polishing processes are performed to remove the disruptive layer(s) created during the substrate separation process and to gradually reduce the substrate roughness. A chemo-mechanical polishing process (CMP) is then applied on one or both sides of the substrate for finalizing the respective surface(s). The orientation of the underlying crystal structure with respect to the finished surface is a determinant factor for the properties of the epitaxial layers to be later grown on the substrate.

During a multi-stage mechanical processing such as described above, bulk single-crystals and substrates are subjected to significant mechanical forces. Semiconductor crystals are, however, known to exhibit high brittleness and low ductility. In particular, fissures or cracks can be easily formed on a semiconductor crystal along preferred cleavage planes of the respective crystal structure, such as in the case of crystal planes of the forms $\{10\overline{1}0\}$ and $\{11\overline{2}0\}$ in semiconductors having a wurtzite crystal structure (e.g. AlN, GaN, InN) or crystal planes of the form $\{110\}$ in semiconductors of a zincblende crystal structure (e.g. GaAs, GaN, InP, etc), which leads to damage or destruction of the semiconductor semi-finished cylinder and/or substrates. Especially, in mechanical processes in which mechanical forces are applied radially (i.e. perpendicular to the outer diameter), the increased probability of cracking along the cleavage planes leads to fissures in the crystals as well as in the substrates, and consequently, to an undesirable reduction in yield.

During the mechanical processing of a semiconductor semi-finished product, the setting of the outer diameter by grinding is the most critical process step, since a large amount of the force exerted by the grinding tool, for e.g. a grinding wheel, is applied perpendicularly to the cylinder outer diameter (i.e. the cylinder lateral surface).

In the mechanical processing of monocrystalline semiconductor substrates, both steps of machining the substrate edges as well as of polishing are critical. For instance, when chamfering the substrate edges, a radial force is applied onto the substrate outer diameter with a cup grinding wheel. During polishing, in which the substrates are guided in rotor disks, a radial force is likewise exerted by these rotor disks onto the outer diameter of the substrates.

Consequently, special attention has to be given to the high brittleness of the semiconductor materials in combination with the presence of the cleavage lattice planes during the mechanical processing of the respective bulk crystals and substrates.

So far, the existing prior art did not address the anisotropy of the mechanical properties of the semiconductor crystal lattice, which is why, in practice, it has been generally accepted that there is always a certain amount of waste of bulk semiconductor crystals or semiconductor substrates caused by the occurrence of cracks during mechanical processing. However, these have a negative impact in the yield of the overall process chain.

During mechanical processing of the outer perimeter of the bulk semiconductor cylinder, it is possible to reduce the occurrence of cracks or fissures within certain limits, although not completely eliminate them, by adjusting the parameters of the mechanical process steps itself, such as the applied force or grinding speed. However, such adjustment has a negative effect on other process parameters, such as an increase in the process duration and costs. Fractures or cracks during mechanical processing of a raw semiconductor substrate obtained after wire-sawing the semiconductor semi-finished cylinder (for e.g. during edge chamfering, mechanical grinding, mechanical or chemo-mechanical polishing, etc.) may also be reduced by adjusting the process parameters, but not fully avoided. Such adjustments also have an adverse effect on other process parameters, such as a significant increase in the duration of the substrate mechanical processing.

None of the known prior art methods has taken into account the special requirements, with regard to crystallographic orientation, that are posed on the processing of single-crystal semiconductors, in bulk or substrate form, by the anisotropy of their mechanical properties. So far, the influence of crystallographic orientation on the susceptibility to cracking of the final semi-finished products and/or substrates has also not been taken into account by the prior art.

A solution for reducing the occurrence of fissures, which depending on the applied mechanical forces may even appear during mechanical processing of low stress or stress-free semiconductor semi-finished products or semiconductor substrates, has not been disclosed.

Therefore, there is a need for solutions that allow to efficiently reduce the amount of defective semiconductor semi-finished products and/or semiconductor substrates, caused by the occurrence of fissures during their mechanical processing, without significantly increasing costs and time of the overall mechanical processing, while improving quality and yield of the semiconductor semi-finished products and semiconductor substrates.

SUMMARY OF THE INVENTION

The present invention has been made in view of the shortcomings and disadvantages of the prior art, and an object thereof is to provide a monocrystalline semiconductor semi-finished product and a monocrystalline semiconductor substrate having improved mechanical robustness to forces applied during production and/or mechanical processing of the external surfaces of semiconductor substrate, and a method of producing such monocrystalline semiconductor semi-finished product and/or substrate.

This object is solved by the subject matter of the independent claims. Advantageous embodiments of the present invention are subject matter of the dependent claims.

According to the present invention, it is provided a monocrystalline semiconductor semi-finished product or monocrystalline semiconductor substrate of improved mechanical robustness against cleavage, the semiconductor semi-finished product or substrate having a central axis and a at least partially curved lateral surface parallel to said central axis, characterized in that the crystal structure of the monocrystalline semiconductor is oriented relative to the central axis and the at least partially curved lateral surface with a predetermined orientation at which: a first crystallographic axis perpendicular to a set of first cleavage planes makes a first tilt angle with a plane transverse to the central axis, and a second crystallographic axis perpendicular to a set of second cleavage planes and to the first crystallographic axis makes a second tilt angle with said plane transverse to the central axis so that each set of parallel cleavage planes that are symmetrically equivalent to either the first or second cleavage planes are inclined relative to the central axis.

According to a further development, the first tilt angle and the second tilt angle are selected such that each set of first and second cleavage planes intersects the at least partially curved lateral surface along a line segment parallel to the central axis with at least a predetermined minimum number of parallel cleavage planes per unit length of the line segment, respectively.

According to a further development, said predetermined minimum number of parallel cleavage planes per unit length is at least 1000 planes per millimetre; and/or said central axis is an axis of symmetry of the cylindrical surface defined by a curved part of said at least partially curved lateral surface.

According to a further development, said first tilt angle is estimated based on a distance between the first cleavage planes normal to the first crystallographic axis and/or said second tilt angle is estimated based on a distance between the second cleavage planes normal to the second crystallographic axis so as to yield said at least predetermined minimum number of parallel cleavage planes per unit length.

According to a further development, the first crystallographic axis and the first tilt angle are further selected based on requirements for epitaxial growth on substrates of the monocrystalline semiconductor.

According to a further development, the monocrystalline semiconductor semi-finished product or substrate further comprises first and second front faces; wherein the first and second front faces are respectively perpendicular to the at least partially curved lateral surface, and/or one or both of the first and second front faces are perpendicular to the central axis; and/or wherein said at least partially curved lateral surface has a curved part that defines a cylindrical surface with said central axis has its symmetry axis.

According to a further development, the semiconductor semi-finished product or semiconductor substrate is made of a semiconductor material selected from a group including silicon, semiconductors of the types III-V-HL, II-VI-HL, and II-VI-Mixed crystals.

According to a further development, the semiconductor semi-finished product or substrate is made of a semiconductor material having one of a wurtzite structure, a diamond structure, and a zincblende structure.

According to a further development, the semiconductor crystal structure is the wurtzite structure, the first crystallographic axis being the $[\bar{1}\bar{1}20]$ axis or any of the crystallographic axes symmetrically equivalent to the $[\bar{1}\bar{1}20]$ axis in the wurtzite structure. Further, for SiC, the first tilt angle may be 4°, with a tolerance of ±0.5°, and/or wherein the second tilt angle is a value selected from the interval [0.015°; 0.153°], or preferably 0.023°.

According to a further development, the semiconductor crystal structure is the diamond structure, the first crystallographic axis being the [111] axis or any of the crystallographic axes symmetrically equivalent to the [111] axis in the diamond structure, or the semiconductor crystal structure is the zincblende structure, the first crystallographic axis being the [110] axis or any of the crystallographic axes symmetrically equivalent to the [110] axis in the zincblende structure.

The present invention further provides a method of producing a monocrystalline semiconductor semi-finished product or monocrystalline semiconductor substrate with improved mechanical robustness against cleavage, the monocrystalline semiconductor semi-finished product or substrate having a central axis and a at least partially curved lateral surface that is parallel to said central axis, the method comprising: performing a process of setting an orientation of the semiconductor crystal structure relative to the central axis and the at least partially curved lateral surface with a predetermined orientation at which: a first crystallographic axis perpendicular to a set of first cleavage planes makes a first tilt angle with a plane transverse to the central axis, and a second crystallographic axis perpendicular to a set of second cleavage planes and to the first crystallographic axis makes a second tilt angle with said plane transverse to the central axis so that each set of parallel cleavage planes that are symmetrically equivalent to either the first or second cleavage planes are inclined relative to the central axis.

According to a further development, the first tilt angle and the second tilt angle are selected such that each set of first and second cleavage planes intersects the at least partially curved lateral surface along a line segment parallel to the central axis with at least a predetermined minimum number of parallel cleavage planes per unit length of the line segment, respectively.

According to a further development, said predetermined minimum number of parallel cleavage planes per unit length is at least 1000 planes per millimetre; and/or said central axis is an axis of symmetry of the cylindrical surface defined by a curved part of said at least partially curved lateral surface.

According to a further development, the method further comprises: estimating said first tilt angle based on a distance between the first cleavage planes normal to the first crystallographic axis and/or estimating said second tilt angle based on a distance between the second cleavage planes normal to the second crystallographic axis so as to yield said at least predetermined minimum number of parallel cleavage planes per unit length.

According to a further development, the first crystallographic axis and the first tilt angle are further selected based on requirements for epitaxial growth on substrates of the monocrystalline semiconductor.

According to a further development, the semiconductor crystal structure is one of a wurtzite structure, a diamond structure, and a zincblende structure.

According to a further development, the semiconductor crystal structure is the wurtzite structure, the first crystallographic axis being the [$\overline{1}\overline{1}20$] axis or any of the crystallographic axes symmetrically equivalent to the [$\overline{1}\overline{1}20$] axis in the wurtzite structure; or the semiconductor crystal structure is the diamond structure, the first crystallographic axis being the [111] axis or any of the crystallographic axes symmetrically equivalent to the [111] axis in the diamond structure; or the semiconductor crystal structure is the zincblende structure, the first crystallographic axis being the [110] axis or any of the crystallographic axes symmetrically equivalent to the [110] axis in the zincblende structure.

According to a further development, the process of setting said predetermined orientation of the semiconductor crystal structure with respect to said central axis of the semiconductor semi-finished product includes: spatially orienting the semiconductor crystal structure with respect to an alignment axis such as to achieve said predetermined orientation of the semiconductor crystal structure with respect to a plane transverse to said alignment axis; and machining an external surface of the spatially oriented semiconductor crystal structure with reference to said alignment axis to form at least one of: a at least partially curved lateral surface that is substantially parallel to said alignment axis, and at least one front face surface that is substantially orthogonal to the alignment axis; wherein the alignment axis of the spatially oriented semiconductor crystal structure is selected to be parallel to the central axis of the semiconductor semi-finished product.

According to a further development, the process of spatially orienting the semiconductor crystal structure with respect to the alignment axis includes: aligning the principal crystallographic axis of an elected reference lattice plane along the alignment direction, the reference lattice plane being transverse to the sets of first and second cleavage planes, and tilting the reference lattice plane in a first direction by the first tilt angle, the first direction corresponding to the first crystallographic axis normal to the set of first cleavage planes, so that the set of first cleavage planes becomes inclined by the first tilt angle relative to the alignment axis and the set of second cleavage planes remains parallel to the alignment axis.

According to a further development, the process of spatially orienting the semiconductor crystal structure with the predetermined orientation respect to the alignment axis further includes: tilting the reference lattice plane in a second direction by the second tilt angle, the second direction corresponding to the second crystallographic axis, so that the set of second cleavage planes becomes inclined by the second tilt angle relative to the alignment axis.

According to a further development, the semiconductor crystal structure is the wurtzite structure, the first crystallographic axis is the [$\overline{1}\overline{1}20$] axis or any of the crystallographic axes symmetrically equivalent to the [$\overline{1}\overline{1}20$] axis in the wurtzite structure. Further, for SiC, the first tilt angle may be 4°, with a tolerance of ±0.5°, and/or wherein the second tilt angle is a value selected from the interval [0.015°; 0.153°], or preferably 0.023°.

According to a further development, the process of spatially orienting the semiconductor crystal structure with respect to the alignment axis includes: aligning the principal crystallographic axis of an elected reference lattice plane along the alignment direction, the reference lattice plane being transverse to the cleavage planes of the first crystallographic form; rotating the reference lattice plane about said alignment direction by a predetermined rotation angle in a clockwise direction or a counter-clockwise direction; and tilting the rotated reference lattice plane by a given tilt angle in a first direction, the first direction corresponding to the crystallographic axis of said set of parallel cleavage planes of the first crystallographic form.

According to a further development, the semiconductor crystal structure is the wurtzite structure, the reference lattice plane is the basal plane (0001), the first crystallographic axis is the [$\overline{1}\overline{1}20$] axis or any of the crystallographic axes symmetrically equivalent to the [$\overline{1}\overline{1}20$] axis in the wurtzite structure. In particular, the semiconductor crystal structure may be AlN having wurtzite structure and the first tilt angle is 0.042° in the direction [$\overline{1}\overline{1}20$], followed by a second tilt by a tilt angle $\delta_2$ of 0.042° in the [$1\overline{1}00$] direction or in the [$\overline{1}100$] direction.

According to a further development, the semiconductor semi-finished product is made of a semiconductor material selected from a group including silicon, semiconductors of the types III-V-HL, II-VI-HL, and II-VI-Mixed crystals.

The accompanying drawings are incorporated into and form a part of the specification for the purpose of explaining the principles of the invention. The drawings are not to be construed as limiting the invention to only the illustrated and described examples of how the invention can be made and used.

BRIEF DESCRIPTION OF THE FIGURES

Further features and advantages will become apparent from the following and more detailed description of the invention as illustrated in the accompanying drawings, in which.

Figure 1:
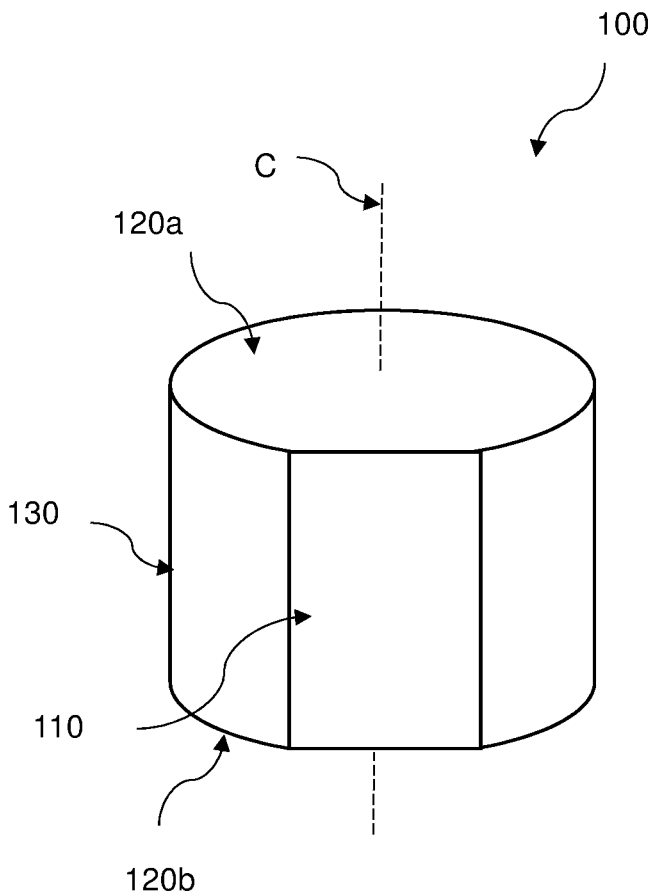
FIG. 1 is a schematic perspective view of monocrystalline semiconductor semi-finished product.

It is noted that since atomic scales will be being discussed in the present application, the dimensions and relative angles shown in the drawings are only intended for the purpose of understanding and are not drawn to scale.

DETAILED DESCRIPTION OF THE INVENTION

The present invention will now be more fully described hereinafter with reference to the accompanying drawings, in which exemplary embodiments of the invention are shown. The present invention may, however, be embodied in many different forms and should not be construed as limited to the embodiments set forth herein. Rather, these embodiments are provided so that the disclosure will be thorough and complete, and will fully convey the scope of the invention to those skilled in the art. Like numbers refer to like elements throughout.

A principle underlying the present invention follows from the inventors having recognized that the occurrence of cracks or fissures in monocrystalline semiconductor semi-finished products and substrates during their respective mechanical processing can be significantly reduced or even eliminated by setting the orientation of the crystallographic structure of the monocrystalline semiconductor to a predetermined orientation relative to the central axis and/or a lateral surface of the semiconductor semi-finished product or substrate and at which the crystallographic axes associated with preferred cleavages lattice planes are inclined with respect to a plane transverse to the central axis by respective tilt angles.

As a result, the parallel cleavage planes associated with a respective crystallographic axis are also inclined relative to the central axis by the same tilt angle and any external mechanical force applied radially on the semiconductor semi-finished product or substrate will be distributed over at least a predetermined minimum number of parallel cleavage planes, irrespectively on the position on the lateral surface where the mechanical force is being applied, with a consequent reduction of the radial force per unit plane. The amount and/or direction of the tilt angle may be set depending on the crystallographic form of the preferred cleavage lattice planes and corresponding crystallographic axis such as to ensure that the mechanical force per unit plane becomes lower than a cleavage threshold characteristic of the specific form of cleavage plane.

Accordingly, the present invention provides a technique for setting an optimal orientation of the crystallographic structure in monocrystalline semiconductor semi-finished products and/or substrates that improves the mechanical robustness of the semiconductor single-crystal against cleavage, and consequently, increases the yield of semiconductor semi-finished products and/or substrates, without noticeable impact on the quality of the epitaxial layers to be grown later onto the end substrates.

The principles of the present invention will be described hereinafter with reference to semiconductor semi-finished products or substrates of AlN, as an example of a semiconductor of the III-V group with a wurtzite crystal structure. Nevertheless, the principles of the present invention are also applicable to any other semiconductor material having a wurtzite, a diamond or a zincblende crystal structure for achieving the same effect of improving their robustness against cleavage, such as any of the semiconductor materials indicated in Table 1.

As mentioned above, fissures or cracks can be easily formed along preferred cleavage planes of semiconductor crystals, such as the cleavage planes of the forms {10$\bar{1}$0} and {11$\bar{2}$0} in semiconductors with a wurtzite structure, and consequently, lead to damage or destruction of the semiconductor semi-finished products and/or substrates during mechanical processing. In particular, in processes where the mechanical force is applied radially (i.e. perpendicularly to the lateral curved surface of the semiconductor semi-finished product or substrate), the higher susceptibility to cracking at forces applied along the cleavage planes leads to cracks in the semiconductor crystals and substrates and thus, to the undesirable reduction of the respective yields. For instance, FIG. 2 depicts the orientation of the cleavage planes of the forms {10$\bar{1}$0} and {11$\bar{2}$0} for a semiconductor semi-finished product 200 (or substrate) of a wurtzite crystal structure, such as AlN, with an on-axis crystallographic orientation. In the on-axis orientation depicted in FIG. 2, the basal plane (0001) of the semiconductor crystal structure is parallel to the front face 220, and consequently, the [0001] crystallographic direction makes a 0° angle with the longitudinal axis C of the semiconductor cylinder 200. The longitudinal axis C referred to hereinafter is defined as a symmetry axis of the cylindrical surface defined by the curved lateral surface of the semiconductor semi-finished product (or substrate). FIG. 2 shows the side parallel to the (0001) lattice plane of the semiconductor semi-finished product 200 (or substrate), when viewed from the respective front face 220, such as the front face 120a in FIG. 1. The primary orientation flat (OF) is defined in the crystallographic direction [1$\bar{1}$00]. A secondary flat may be optionally provided in the crystallographic direction [11$\bar{2}$0]. Instead of the primary flat OF, a notch (i.e. a lateral indentation in the substrate wafer for precise positioning on semiconductors production plants) may be provided in the [1$\bar{1}$00] direction. In addition, two forms of cleavage planes are depicted in FIG. 2, which shows three symmetrically equivalent lattice planes of the form {10$\bar{1}$0} and three symmetrically equivalent lattices planes of the form {11$\bar{2}$0}. The form {10$\bar{1}$0} designates the set of lattice planes that can be obtained from the (10$\bar{1}$0) plane by a symmetry operation, describing the ideal crystal structure of semiconductor (point group 6nn) and thus, includes the planes (10$\bar{1}$0), (1$\bar{1}$00) and (0$\bar{1}$10). The crystallographic planes (2$\bar{1}\bar{1}$0), (1$\bar{2}$10) and ($\bar{1}\bar{1}$20) are included in the form {11$\bar{2}$0}, which designates the set of lattice planes that can be obtained from the (11$\bar{2}$0) plane by a symmetry operation. All cleavage planes of the forms {10$\bar{1}$0} and {11$\bar{2}$0} intersect the front face on the side parallel to the (0001) lattice plane and the opposite, front face (not shown) of semiconductor semi-finished product 200 with an angle of 90°. The cleavage planes of the forms {10$\bar{1}$0} and {11$\bar{2}$0} also intersect the lateral surface of the semiconductor semi-finished product 200 at a right angle, which means that the semiconductor semi-finished product 200 will be prone to fissures when radial forces are applied along the depicted cleavage planes.

Semiconductor substrates are generally used with either an on-axis orientation or an off-axis orientation. In the on-axis orientation, the reference lattice plane elected for the formation of epitaxial layers onto the substrate is parallel to the substrate face where the epitaxial layers will be formed or to a front face of the semiconductor semi-finished product from which the substrates are made. The crystalline axis of the reference lattice plane is then aligned with the longitudinal axis C of the semiconductor substrate or semi-finished product. In the case of an off-axis orientation, the reference lattice plane for epitaxial growth is not parallel to the substrate face but rather inclined by a small tilt angle, which corresponds the angle between the respective crystallographic axis and the central axis C. This small inclination of the reference lattice plane serves the purpose of improving the quality of the epitaxy layers to be grown onto the substrate. The direction and degree of inclination is selected depending on the substrate semiconductor material and epitaxial layers to be grown.

Figure 3A:
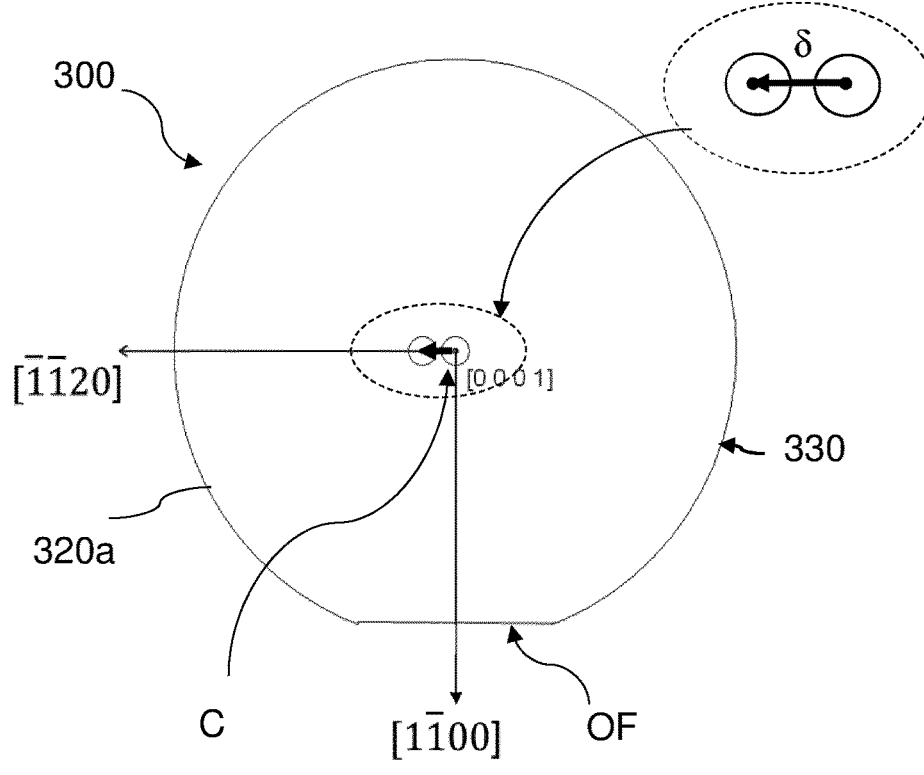
FIG. 3A is a schematic top view of a conventional semiconductor substrate with a wurtzite structure and a 4° off-axis orientation (viewed from a front face), in which the basal plane (0001) is tilted by an angle δ of 4° in the [$\overline{1}\overline{1}20$] direction with respect to the front face of the semiconductor substrate; the short arrow in the inset depicts the vector component of the [0001] direction on the plane of FIG. 2.
Figure 3B:
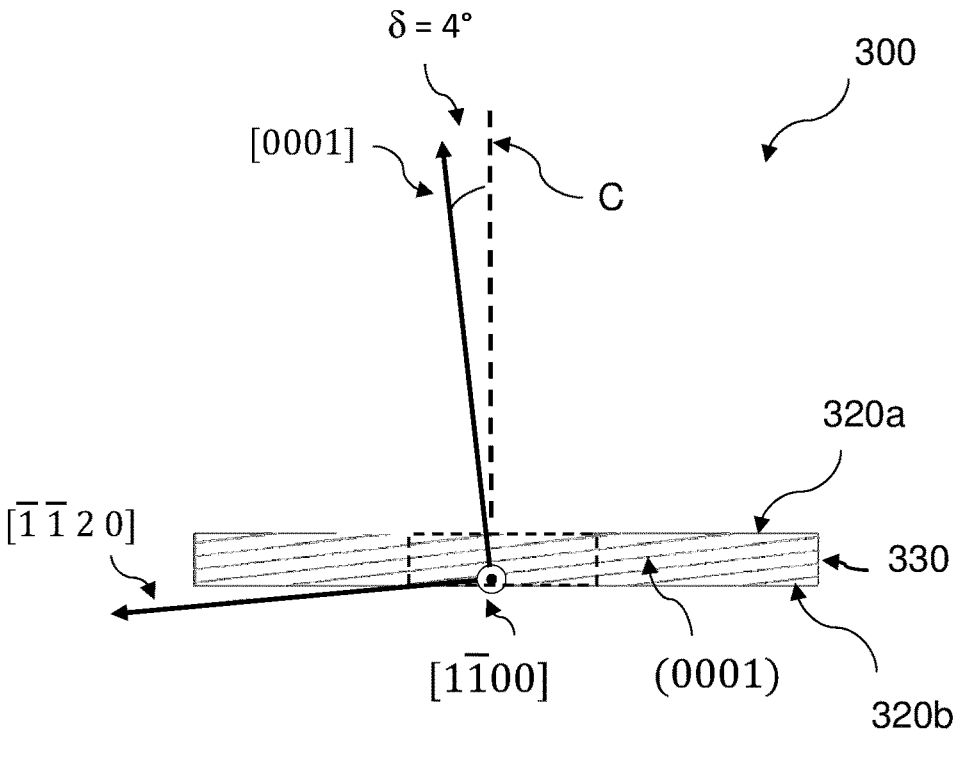
FIG. 3B is a schematic side view of the semiconductor substrate shown in FIG. 3A, when viewed from the side containing the [1T00] crystallographic direction, and depicts the inclination of the basal plane (0001) and corresponding [0001] crystallographic axis in the [TT20] direction by the angle δ of 4° (i.e. in the direction parallel to the primary flat OF in FIG. 3A)

In order to set the selected degree of off-axis orientation in the semiconductor semi-finished product or substrate, the as-grown semiconductor crystal or semiconductor semi-finished product may be spatially oriented with respect to a reference direction (for e.g. the vertical direction) such that the crystal axis of the reference lattice plane is inclined with respect to the reference direction by the desired tilt angle. The lateral outer surface of the so-spatially oriented semiconductor crystal is then mechanically processed to set its cross-section to the desired substrate diameter and the one or both front ends set to planar surfaces perpendicular to the reference axis C. Semiconductor substrates with the desired off-axis orientation may be obtained from an as-grown semiconductor crystal that is first spatially oriented as mentioned above, followed by cutting substrate wafers in a direction transverse to the reference direction C. Alternatively, the semiconductor substrates may be cut in a direction parallel to a front face of a semiconductor semi-finished product having already pre-set the desired off-axis orientation. A good quality of epitaxial layers and of the subsequently processed components may be achieved for semiconductor substrates having an off-axis orientation of a few degrees, for e.g. 4° in SiC substrates. An example of a semiconductor substrate 300 with a wurtzite structure and a 4° off-axis orientation of the basal plane (0001) in the [$\bar{1}\bar{1}$20] direction is depicted in FIGS. 3A and 3B. FIG. 3A depicts the orientation of the crystallographic axis for the ($\bar{1}\bar{1}$20), (1$\bar{1}$00) and (0001) lattice planes, when viewed from a top, front face 320a (i.e. from the side (0001)) of the 4° off-axis semiconductor substrate 300, showing the [1$\bar{1}$00] crystallographic direction, which is parallel to the substrate front face 320a, and the vector component of the [$\overline{11}20$] direction (which is inclined downwards by 4°) along the front face 320a. The inclination of the [0001]-axis is represented by the short arrow in the inset of FIG. 3A, which depicts the vector component of the [0001] axis along the front face 320a. A primary flat is in general defined to indicate the [1$\overline{1}$00] direction, although a notch marking the [1$\overline{1}$00] direction could be used instead. A secondary flat could also be provided in the [$\overline{11}20$] direction. FIG. 3B is a side view of the semiconductor substrate 300 depicted in FIG. 3A, when viewed from the [1$\overline{1}$00] direction (side of the primary flat OF). As it can be seen from FIG. 3B, the basal plane (0001) of the semiconductor crystal is tilted out of the plane parallel to the front face 320a in the crystallographic direction [$\overline{11}20$] and the respective crystal axis [0001] is inclined with respect to the central axis C of the semiconductor substrate by a tilt angle δ of 4° (+/−0.5°).

As mentioned above, the 4° tilt of the basal plane (0001) in the [$\overline{11}20$] direction allows to achieve an optimal step flow during epitaxy and thus, ensures an optimal quality of the subsequent epitaxial layers grown onto the 4° off-axis substrate. This tilting of the basal plane (0001) and principal axis [0001] is also reflected in the crystallographic orientation of the cleavage planes. For instance, five of the six cleavage planes of the {10$\overline{1}$0} and {11$\overline{2}$0} forms depicted in FIG. 2 for the on-axis orientation, are no longer orthogonal to the front face(s) 320a, 320b of the semiconductor substrate with the 4° off-axis orientation, and consequently, no longer intersect the cylindrical lateral surface 330 at a right angle. Only the cleavage plane (1$\overline{1}$00) still intersects the front face(s) 320a, 320b of the semiconductor substrate 300 with an angle of 90°, and remains parallel to the longitudinal axis C. On the other hand, the cleavage plane ($\overline{11}20$) displays the largest change in the crystallographic orientation with respect to the front face 320a.

Figure 4A:
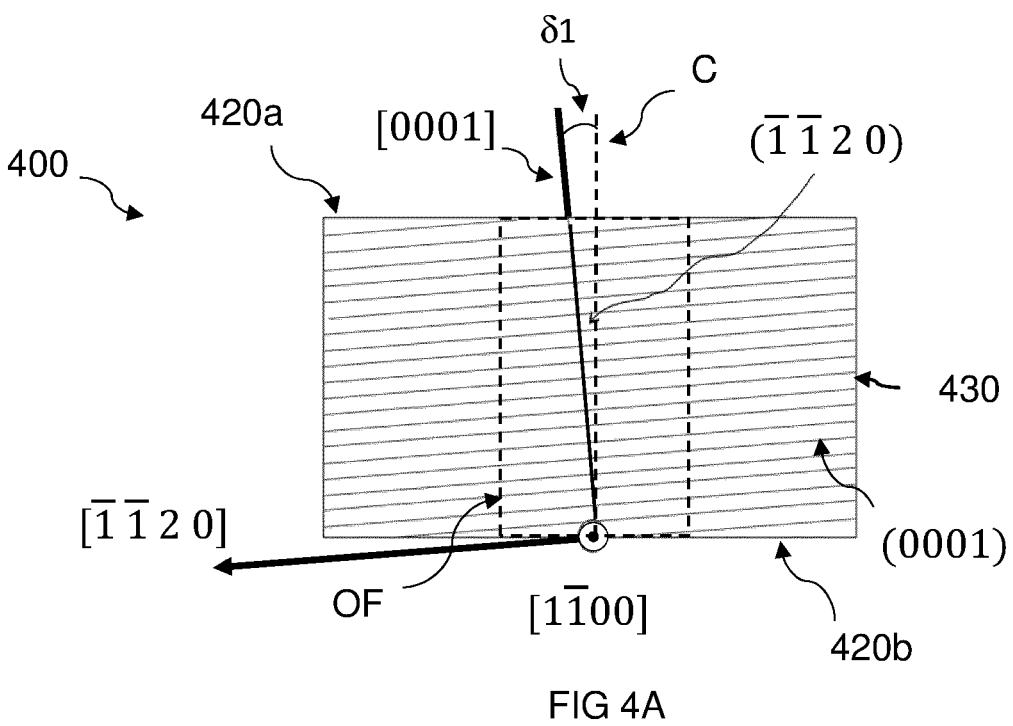
FIG. 4A is a schematic side view of a semiconductor semi-finished product with a wurtzite structure and a 4° off-axis orientation, viewed from a side containing the [1T00] crystallographic direction (i.e. the side of the primary flat OF), and depicts the inclination of the basal plane (0001) (reference lattice plane) and of the corresponding [0001] crystallographic direction towards the initial [TT20] direction by a tilt angle δ of 4°.
Figure 4B:
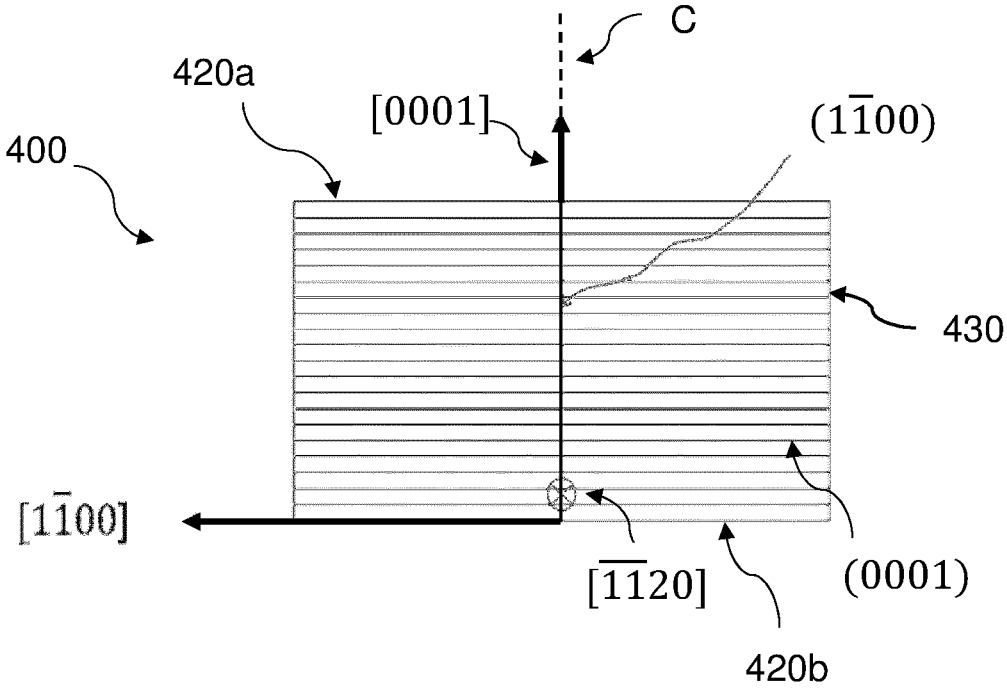
FIG. 4B is a further schematic side view of the semiconductor semi-finished product shown in FIG. 4A, when viewed from a side opposite to the initial [TT20] crystallographic direction, and depicts the orientation of a cleavage plane (1T00) which is parallel to the central symmetry axis C of the semiconductor cylinder; the crystallographic axis [TT20] in the 4° off-axis orientation is not perpendicular to the plane of FIG. 4B but points downwards in the viewing direction by an inclination angle of 4°.

A similar situation occurs in a monocrystalline semiconductor semi-finished product 400 having a 4° off-axis orientation, such as illustrated in FIGS. 4A-4B. FIG. 4A shows a side view of the semiconductor semi-finished product 400, viewed from the [1$\overline{1}$00] direction (i.e. from the side of the primary flat OF), and depicts the orientation of the crystalline directions [$\overline{11}20$], [1$\overline{1}$00] and [0001] with respect to the front face 420a (on the side (0001)) and the cylinder central axis C, as well as the inclination of the cleavage plane ($\overline{11}20$). As it can be seen from FIG. 4A, the cleavage plane ($\overline{11}20$) no longer intersects the front face 420a at a right angle, and consequently, it is no longer aligned in parallel with the central axis C, but rather exhibits an inclination of 4° with respect to the central axis C due to the 4° off-axis orientation of the basal plane (0001) and respective [0001] crystalline axis. On the other hand, the [1$\overline{1}$00] direction remains transverse to the central axis C.

FIG. 4B shows a further side view of the semiconductor semi-finished product 400 illustrated in FIG. 4A, now viewed from a direction that makes 90° with the [1$\overline{1}$00] crystalline direction (i.e. from a side opposite to the [$\overline{11}20$] direction before tilting the basal plane (0001)). As it can be seen from FIG. 4B, the [1$\overline{1}$00] direction remains transverse to the central axis C of the semiconductor semi-finished product 400 and the cleavage plane (1$\overline{1}$00) is the only lattice plane that has not changed orientation with the tilting of the basal plane (0001) by 4° in the direction [$\overline{11}20$]. Therefore, the cleavage plane (1$\overline{1}$00) continues to intersect the front face 420a (and 420b) at a right angle and remains parallel to the cylinder central axis C. The crystallographic direction [$\overline{11}20$] is no longer perpendicular to the central axis C, as it is tilted by 4° downwards with respect to the front face 420a (this is illustrated in FIG. 4B by the vertical displacement of the symbol representing the tail of the vector in the direction [$\overline{11}20$]). The intersection of the equivalent, parallel cleavage planes (0001) with the lateral side 430 of the semiconductor semi-finished product 400 is represented in FIG. 4B by the horizontal lines. Except for the (1$\overline{1}$00) planes, all other remaining cleavage planes of the respective forms {10$\overline{1}$0} and {11$\overline{2}$0}, change their orientation with respect to the front face 420a, after the 4° tilting of the basal plane (0001), the respective inclination angles falling between the maximum change by 4° exhibited by the cleavage planes ($\overline{11}20$) and the zero change of the cleavage planes (1$\overline{1}$00).

However, in either the on-axis or the 4° off-axis orientations illustrated above, the semiconductor semi-finished products or semiconductor substrates are still very prone to fissures during mechanical processing, in particular when radial mechanical forces are applied at regions where cleavages planes intersect their respective cylindrical surfaces in alignment with the symmetry axis C, as it is the case for the cleavage planes (1$\overline{1}$00) described above.

Figure 5:
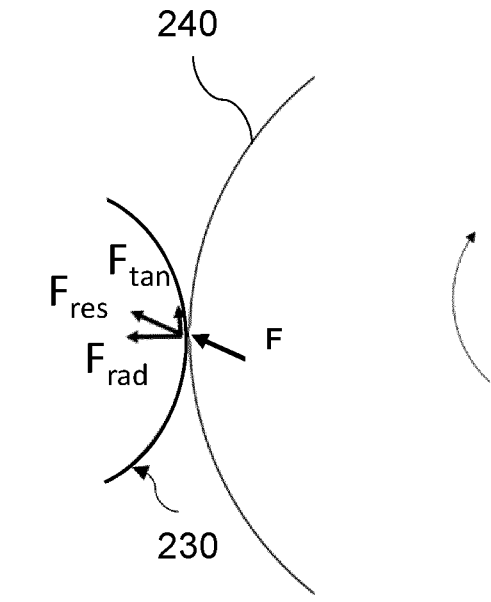
FIG. 5 is a top view depicting the components of the mechanical force F applied onto the lateral side of a semiconductor semi-finished product (or substrate) by a grinding wheel.
Figure 6:
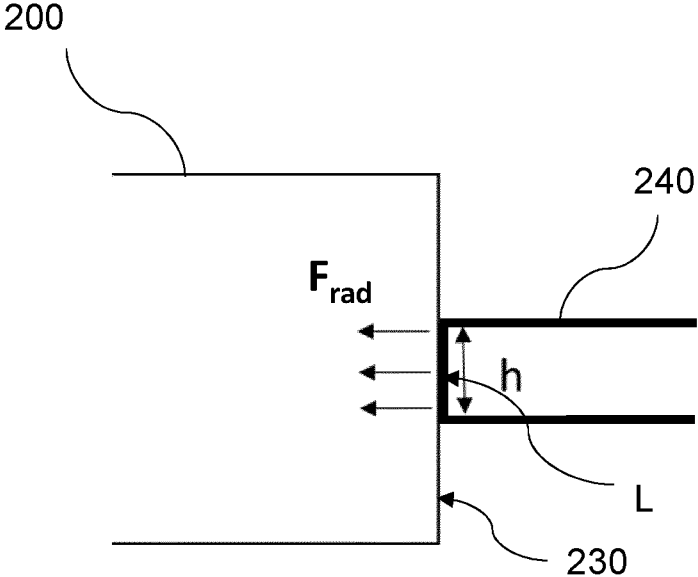
FIG. 6 is a side view depicting the radial mechanical force applied onto the semiconductor semi-finished product (or substrate) by the grinding wheel.

As illustrated in FIG. 5, during mechanical processing of monocrystalline semiconductor semi-finished products (or substrates), it can be assumed, in a first approximation, that the tool used during a mechanical processing, such as grinding, applies a mechanical force F along a line segment L (force line segment) on the surface of the single-crystal body and which propagates radially into the single-crystal body. The decisive factor in terms of cleavage is the intensity of the force exerted inwards onto the single-crystal semiconductor semi-finished product, i.e. the radial component $F_{rad}$ of the total force F. Tangential force components ($F_{tang}$) that might occur during machining can be neglected for the purpose of evaluating its effect on cleavage. The length of line segment L is approximately the length of the contact region with the respective processing tool, such as the thickness h of a grinding wheel, as illustrated in FIG. 6. In fact, during machining, the mechanical force is not applied along a single line segment L of length h, but rather onto a very narrow area of the same h. This narrow area can be regarded as being formed by a series of parallel line segments. The conditions for achieving a reduction of cleavage along a line segment according to the principles of the present invention, which will be explained below, are then applicable to each of these individual lines.

For the purpose of evaluating the effect of the radial mechanical force applied inwards onto the cleavage planes at the contact region, we take into account both the contact region as well as the actual length of the line segment(s) L onto which the mechanical force is actually applied. The length h of the line segment L and/or narrow area is essentially determined by the thickness h of the processing tool.

During mechanical processing of a semiconductor semi-finished product with off-axis orientation in a given crystallographic direction, such as illustrated above with reference to FIGS. 4A-4B, or with an on-axis orientation as illustrated in FIG. 2, the radial forces applied along the outer perimeter of the crystal cylindrical surface, for e.g. by a grinding wheel may cause the development of fissures on the crystal depending on the position/region along the cylinder perimeter where this radial force is applied. The following extreme situations can be distinguished with regard to the orientation of the different cleavage planes in relation to the application region of the radial force, as illustrated in FIGS. 7 and 8.

Figure 7:
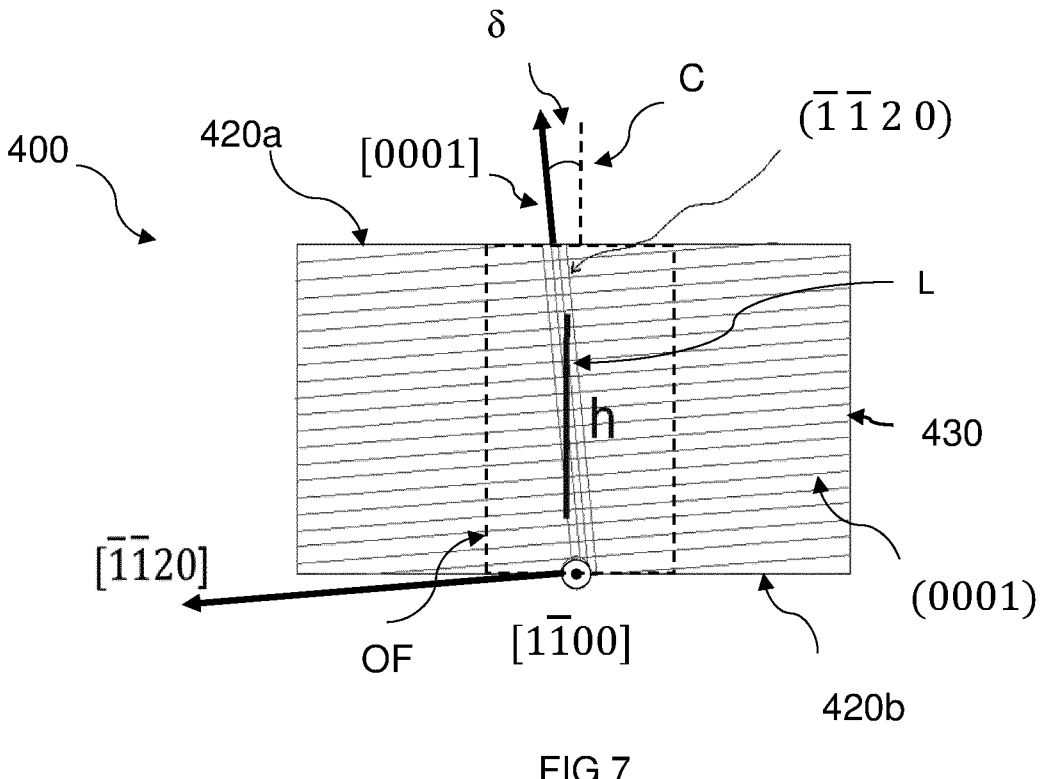
FIG. 7 is a further schematic side view of the semiconductor semi-finished product with a wurtzite structure and the 4° off-axis orientation, when viewed from the direction [1T00] (i.e. viewed from the side of the primary flat OF), and depicts the intersection of lattice planes (TT20) by a force line segment L.

FIG. 7 shows a further schematic side view of a semi-conductor semi-finished product 400 with wurtzite structure, such as AlN, and a 4° off-axis orientation ($\delta$=4°) in a single crystallographic direction (i.e. the [$\overline{1}\overline{1}$20] direction), when viewed from the direction [1$\overline{1}$00] (i.e. viewed from the primary flat OF), and representing the cleavage planes ($\overline{1}\overline{1}$20) that intersect a force line segment L along which the mechanical force is applied (where h represents the thickness of the grinding wheel). As depicted in FIG. 7, the inventors have recognized that, because the cleavage planes ($\overline{1}\overline{1}$20) are not parallel to the cylinder axis C in the 4° off-axis orientation, and therefore, are not transverse to the front face 420a of the semiconductor semi-finished product 400, the radial force applied, in a first approximation, along the line segment L in the direction [1$\overline{1}$00], for e.g. by a grinding wheel, is simultaneously applied not only on one ($\overline{1}\overline{1}$20) planes but rather on a plurality of inclined, parallel cleavage planes ($\overline{1}\overline{1}$20) that intersect the lateral surface of the semiconductor semi-finished product 400 at this force line segment L of length h. Based on the atomic distances in the AlN crystal structure, it is estimated that the radial force actuating along the line segment L can be distributed over a number of equivalent, parallel cleavage planes of the form $\{\overline{1}\overline{1}20\}$, e.g. the cleavage planes ($\overline{1}\overline{1}$20), which is up to $2.6 \times 10^5$ planes per mm of the line segment length, in the case of the illustrated 4° off-axis orientation. This means that the force applied onto each individual cleavage plane ($\overline{1}\overline{1}$20) is strongly reduced, and therefore, the risk for propagation of fissures within the individual parallel cleavage planes can be significantly reduced.

Figure 8:
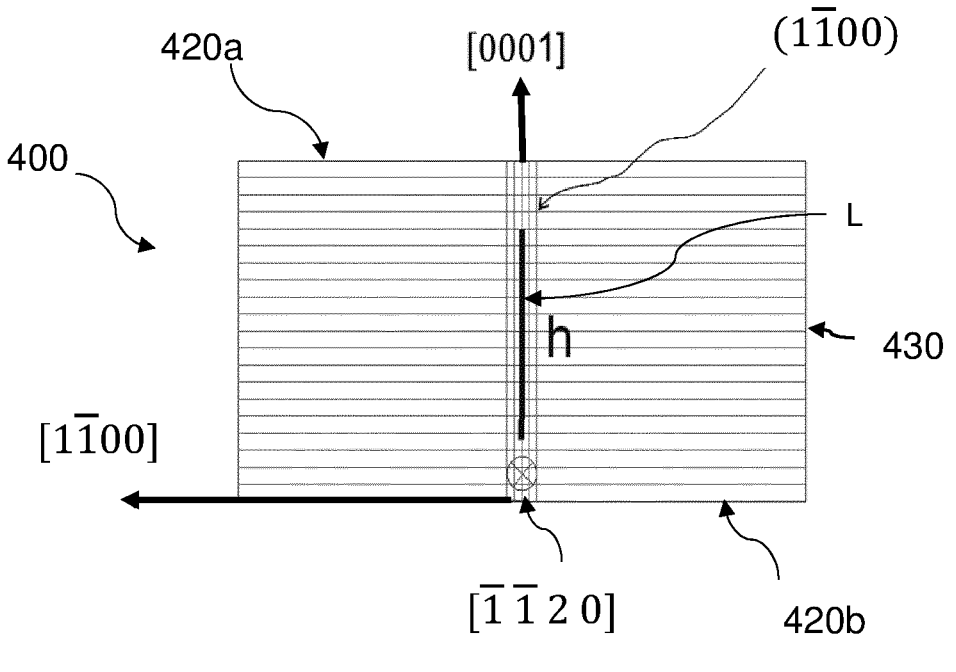
FIG. 8 is a further schematic side view of the semiconductor semi-finished product shown in FIG. 7, now viewed in the [TT20] direction, and depicts the intersection of lattice planes (1T00) by a further force line segment L.

FIG. 8 is a further schematic side view of the semiconductor semi-finished product 400 shown in FIG. 7, now viewed from the side opposed to the [$\overline{1}\overline{1}$20] direction, and illustrates the other extreme situation which occurs when radial forces are applied along a line segment L parallel to the C axis and positioned at the [11$\overline{2}$0] direction. As depicted in FIG. 8, the inventors have recognized that the cleavage planes (1$\overline{1}$00) are oriented at a right angle with respect to the front face 420a of the semiconductor semi-finished product 400 and intersect the cylindrical lateral surface 430 along a line parallel to the central axis C, from the bottom front face 420b up to the upper front face 420a. In this case, in a first approximation, the radial force is applied by the grinding wheel along the line segment L in the direction [11$\overline{2}$0] but can only be distributed over a single or very few of the parallel, cleavage planes (1$\overline{1}$00). Consequently, since in this case the applied force will not be distributed over a large number of cleavage planes (1$\overline{1}$00), as opposed to the situation illustrated in FIG. 7 for the cleavage planes ($\overline{1}\overline{1}$20), the maximum force applied during machining is actually applied over a single or a reduced number of cleavage planes (1$\overline{1}$00). This results in a very high probability of cracking, which can easily lead to the breakage of the single-crystal semiconductor semi-finished product 400 during mechanical processing.

All other remaining cleavage planes in the forms $\{10\overline{1}0\}$ and $\{\overline{1}\overline{1}20\}$ are not parallel to the C axis due to the 4° tilting of the basal plane (0001) in the direction [$\overline{1}\overline{1}$20] and exhibit a behaviour in terms of robustness to cleavage that lies between the two extreme cases described above for the cleavage planes ($\overline{1}\overline{1}$20) and (1$\overline{1}$00).

From the above, it follows that semiconductor semi-finished products and/or substrates having an off-axis orientation in the crystallographic direction associated with cleavage planes of a first crystallographic form may still exhibit preferential cleavage planes of a second crystallographic form e.g. transverse to the cleavage planes of the first form, whose direction remains parallel to the central axis C of the semiconductor cylinder 400. This is the case of the cleavage planes (1$\overline{1}$00) in a first tilt angle for improving the quality of epitaxial growth, for instance the 4° off-axis orientation, illustrated in FIGS. 7-8, which remain by far the most sensitive cleavage planes against fissures and cracks during mechanical processing and for which the occurrence of cracks along these cleavage planes is highly probable. Thus, the inventors have realized that a first tilt angle for improving the quality of epitaxial growth, for instance the 4° off-axis orientation, of the semiconductor semi-finished product, which is used in the prior art for the different purpose of improving the quality of epitaxy of materials to be grown onto the semiconductor substrates, may bring a beneficial, surprising effect with regard to the reduction of cleavage along certain crystallographic directions if the degree of inclination is sufficient for reducing cleavage, but this positive effect is not achieved at every position along the perimeter of the cylindrical surface of the semiconductor semi-finished product or semiconductor substrate, in particular, at the positions where the cleavage planes of a second form, such as the (1$\overline{1}$00) planes, intersect the outer cylinder surface.

The present invention provides a method for setting an optimal orientation of the semiconductor crystal structure in monocrystalline semiconductor semi-finished products and/or substrates that solves the problem related to the formation of fissures/cracks formed along the crystal cleavage planes during mechanical processing of the monocrystalline semiconductor, as it is the case of the cleavage planes (1$\overline{1}$00) in the semiconductor wurtzite structure with the 4° off-axis orientation illustrated in FIGS. 7-8.

A principle underlying the present invention lies in making possible to reduce or even prevent the susceptibility of the semiconductor semi-finished product or substrate to cracking along preferred cleavage planes, such as the lattice planes ($\overline{1}\overline{1}$20) and/or (1$\overline{1}$00) in the wurtzite structure, by setting a specific orientation of the underlying crystallographic structure relative to the central axis and/or lateral surface of the semiconductor semi-finished product (or semiconductor substrate) at which a first crystallographic axis perpendicular to a set of first cleavage planes makes a first tilt angle with a plane transverse to the central axis, and a second crystallographic axis perpendicular to a set of second cleavage planes and to the first crystallographic axis makes a second tilt angle with said plane transverse to the central axis so that each set of parallel cleavage planes that are symmetrically equivalent to either the first or second cleavage planes are inclined relative to the central axis.

The set of first cleavage planes corresponds to the set of parallel cleavage planes associated with a given crystallographic axis, such as the cleavage lattice planes ($\overline{1}\overline{1}$20) in the wurtzite structure. The set of second cleavage planes corresponds to a set of parallel cleavage planes associated with another crystallographic axis and which are transverse to the first cleavage planes, such as the cleavage lattice planes (1$\overline{1}$00) in the wurtzite structure.

At least a set of cleavage lattice planes of a given crystallographic form intersects the lateral surface of the semiconductor semi-finished product (or substrate) along a line segment parallel to the central axis C with at least a predetermined minimum number of parallel cleavage planes per unit length, while maintaining the benefits that an off-axis orientation of the reference lattice plane brings to the epitaxy qualities of the respective semiconductor substrates, such as the 4° off-axis orientation of the basal plane (0001) in an AlN semiconductor.

The principles of the present invention will be described below with reference to a semiconductor with a wurtzite structure, such as AlN, and a 4° off-axis orientation in the [$\overline{1}\overline{1}20$] direction. Nevertheless, the present invention is applicable to single-crystal semi-finished and products and substrates of other mono-crystalline semiconductor materials, having a crystal structure other than the wurtzite structure, other preferential cleavages planes, and/or other off-axis orientations, to improve their robustness against cleavage.

In order to reduce or avoid the formation of cracks along preferential cleavage planes, the present invention sets a specific orientation of the crystal structure on the semiconductor semi-finished products (or semiconductor substrates) with respect to the respective external surface(s), such as the lateral surface and/or one or both of the front faces of the semiconductor semi-finished product or substrate. In the specific orientation, the cleavage planes of a given crystallographic form, such as the cleavage planes ($1\overline{1}00$) in a semiconductor with wurtzite structure, are spatially oriented such as to satisfy the condition of any radial force applied during mechanical processing on the lateral surface of the semiconductor semi-finished products or substrate being distributed over at least a predetermined minimum number of parallel cleavage planes of the given form per unit length of the force line segment L, and irrespectively on the position around the outer perimeter of the semiconductor semi-finished product or substrate.

The minimum number of parallel cleavage planes intersecting a force line segment per unit length may be estimated based on the atomic distances in the semiconductor crystal lattice such as to obtain an optimal value at which the radial force per cleavage plane becomes lower than a given cleavage threshold for the respective form of cleavage plane. For instance, for the case of the cleavage planes ($1\overline{1}00$) in a semiconductor wurtzite structure, the inventors have found that a significant reduction in the occurrence of cracks/fissures can be achieved with a minimum number of 1.000 equivalent, parallel cleavage planes ($1\overline{1}00$) per mm of the force line segment L. A preferred number of intersecting planes ($1\overline{1}00$) corresponds to 1.500 equivalent, parallel cleavage planes per mm of the force line segment length. It was further estimated that the desired increase in robustness against cleavage may be achieved, without affecting the epitaxy properties of the 4°-off semiconductor semi-finished product or substrate, for any number of intersecting cleavage planes up to a maximum number of 10.000 equivalent, parallel cleavage planes per mm of the force line segment.

The distribution of the applied mechanical force over a large number of parallel cleavage planes of a same type, such as the planes ($1\overline{1}00$), per unit length of the force line segment allows to reduce the probability of cracking. Nevertheless, as the number of cleavage planes intersecting the line force segment L is closely related with their inclination with respect to the cylinder front faces, it is desirable to keep the degree of inclination of these cleavage planes ($1\overline{1}00$) as low as possible, such as not to affect negatively the quality of the epitaxial growth on the final substrates. For this reason, the number of cleavage planes intersecting the force line segment, and consequently, the inclination angle with respect to the line force segment L, is preferably selected based on the type of semiconductor material and crystal structure of the substrate and/or semi-finished product to ensure that the radial force per cleavage plane is lower than the cleavage threshold for the respective type of cleavage plane, while still achieving the desired effect of improved epitaxy of semi-finished product and the substrates made therefrom.

Exemplary embodiments of semiconductor semi-finished products having a predetermined orientation of the underlying semiconductor crystal structure that improves mechanical robustness along the entire perimeter of the lateral cylindrical surface are illustrated in FIGS. 9A-9B and FIGS. 10A-10B for the case of a semiconductor crystal with a wurtzite structure and preferential cleavage planes ($\overline{1}\overline{1}20$) and ($1\overline{1}00$). In the illustrated embodiments, the basal plane (0001) corresponds to the elected reference lattice plane for guiding the epitaxial growth on the future substrates. The relative dimensions and angles used in FIGS. 9A-9B and FIGS. 10A-10B are only intended for the purpose of facilitating understanding and are not to scale. The exemplary predetermined orientations are also applicable to substrates of similar semiconductor material and/or crystal structure.

Figure 9A:
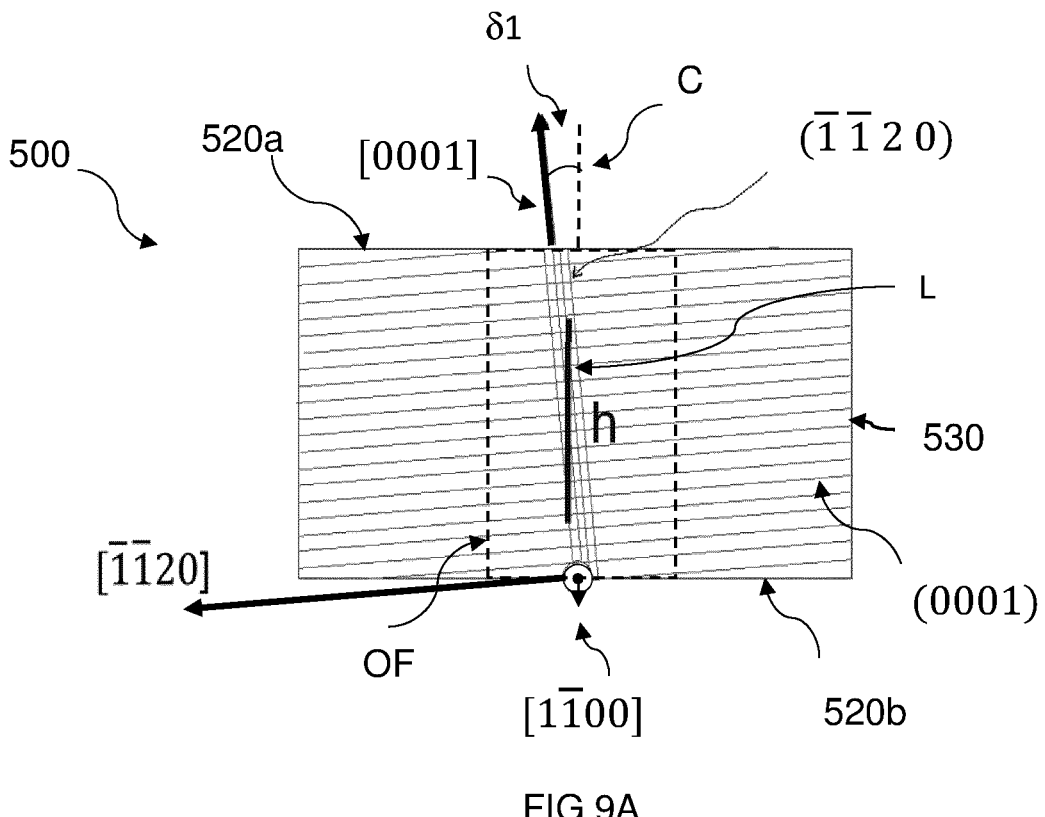
FIG. 9A is a schematic side view (viewed from the [1T00] direction) of a semiconductor semi-finished product with a wurtzite structure and a predetermined crystal orientation according to an exemplary embodiment, in which the basal plane (0001) is inclined by a first tilt angle δ₁ in the [TT20] direction and is additionally tilted by a second tilt angle δ₂ in the [1T00] direction in a counter-clockwise manner; an exemplary force line segment L along which a radial force may be exerted onto the lateral surface of the semiconductor semi-finished product during mechanical processing is also depicted.
Figure 9B:
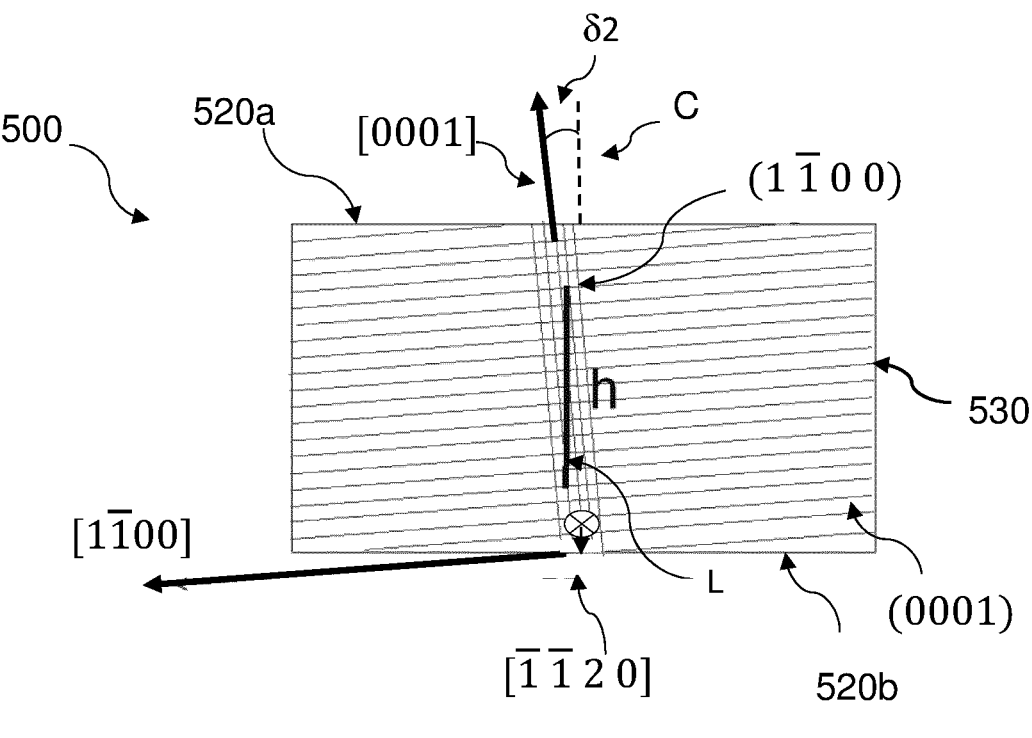
FIG. 9B is a further schematic side view of the semiconductor semi-finished product shown in FIG. 9A and depicts the inclination of the basal planes (0001) and the cleavage planes (1T00) due to the tilt by the second tilt angle δ₂ (viewed in the [TT20] direction)

FIGS. 9A-9B illustrate schematically a semiconductor semi-finished product 500 according to an exemplary embodiment, in which the spatial orientation of the wurtzite crystal structure with respect to the longitudinal axis C of the semiconductor semi-finished product 500 (or with respect to one or both of its front ends 520a, 520b and/or lateral surface 530), in addition to an off-axis orientation of the basal plane (0001) in the direction [$\overline{1}\overline{1}20$] by a first tilt angle $\delta_1$ (for e.g. $\delta_1$=4°±0.5° as depicted in FIG. 9A), further includes a tilt of the basal plane (0001) by a non-zero, second tilt angle $\delta_2$ in the [$1\overline{1}00$] direction with respect to a plane transverse to the central axis C, for e.g. the front face 520a of the semiconductor semi-finished product 500, as shown in FIG. 9B. This results in the crystallographic axis [$\overline{1}\overline{1}20$] making a non-zero angle with the front face 520a by an amount corresponding to the first tilt angle $\delta_1$. Similarly, the crystallographic axis [$1\overline{1}00$] is inclined relative to the front face 520a by an angle corresponding to the second tilt angle $\delta_2$. Consequently, not only the cleavage planes ($\overline{1}\overline{1}20$) are tilted with respect to the central axis C of the semiconductor semi-finished product 500 by the tilt angle $\delta_1$, as shown in FIG. 9A, but also the cleavage planes ($1\overline{1}00$) are inclined with respect to central axis C by the tilt angle $\delta_2$, as shown in FIG. 9B. Thus, assuming in a first approximation that a processing tool applies radial forces along a line segment L of length h on the curved lateral surface 530, which is defined as the line segment on a plane tangent to the lateral surface 530 at the region of contact, there is always a plurality of parallel cleavage planes of the form {$10\overline{1}0$} per unit length that intersect the force line segment L, irrespectively of the position of the line segment L (i.e. the region where the radial force is being applied) along the outer perimeter of the semiconductor semi-finished product 500.

Thus, a situation in which the radial force applied during a grinding process is exerted onto a single or only a few cleavage planes of the type ($1\overline{1}00$) at certain positions, such as described with reference to FIG. 4B above, does not occur in the semiconductor semi-finished product 500 with the predetermined orientation described above.

Furthermore, by estimating the value of the first tilt angle $\delta_1$ and/or the second tilt angle $\delta_2$ that yields the at least predetermined minimum number of intersecting, parallel cleavage planes of the respective crystallographic form per unit length of the line segment, and at which the radial force applied per plane becomes lower than a given cleavage threshold characteristic of the specific cleavage plane, the occurrence of fissures during mechanical processing of the semiconductor semi-finished product 500, or of a semiconductor substrate having the same predetermined orientation, can be significantly reduced or even avoided in a controlled manner.

For instance, the first tilt angle $\delta_1$ may be estimated based on the known distance between two, equivalent parallel cleavages planes of the first crystallographic form, for e.g. the ($\overline{1}\overline{1}20$) planes in the illustrated embodiment, a known cleavage threshold for the specific type of cleavage plane, and eventually already taking into account the parameters of the mechanical process to be used (e.g. height h of the grinding tool at the contact region, typically applied forces and grinding speed, etc.). Alternatively, the first tilt angle $\delta_1$ may be empirically determined by means of experimentation for a specific application. The second tilt angle $\delta_2$ may also be estimated based on the distance between two, equivalent parallel cleavages planes of the second crystallographic form, for e.g. the ($1\overline{1}00$) planes in the illustrated embodiment, or determined empirically.

Figure 10A:
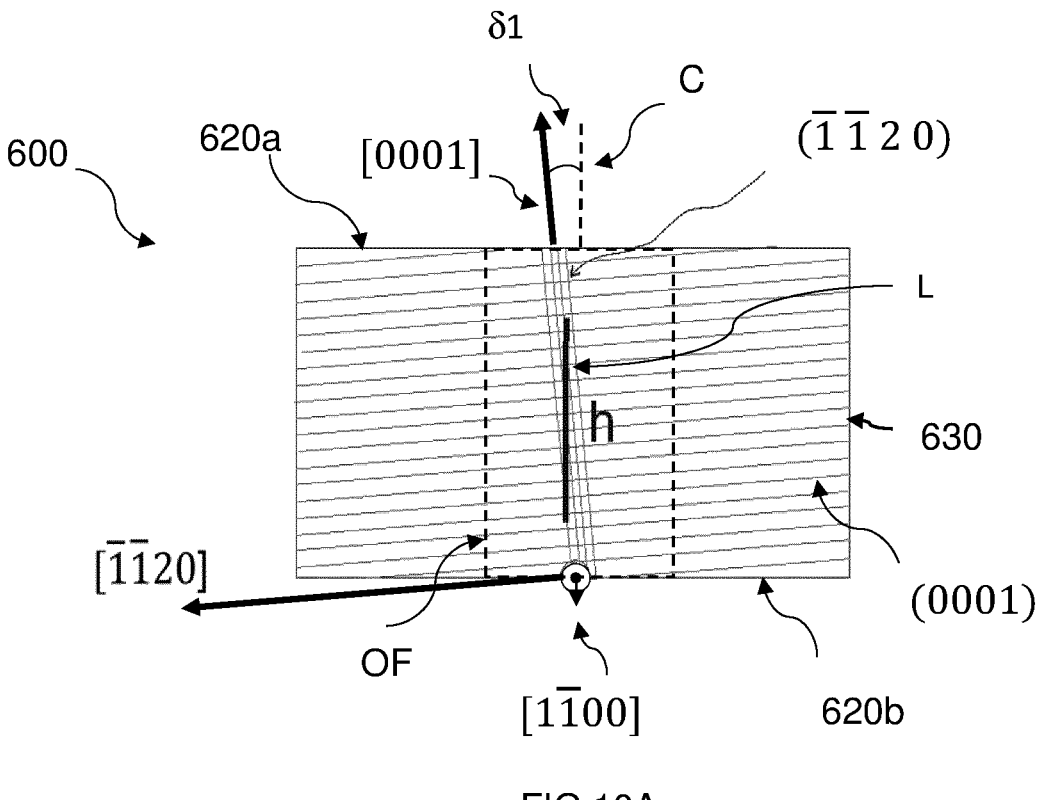
FIG. 10A is a schematic side view (viewed in the [1T00] direction) of a semiconductor semi-finished product with a wurtzite structure and a predetermined crystal orientation according to a further exemplary embodiment, in which the basal plane (0001) is inclined by a first tilt angle δ₁ in the [TT20] direction and by a second tilt angle δ₂ in the [T100] direction.
Figure 10B:
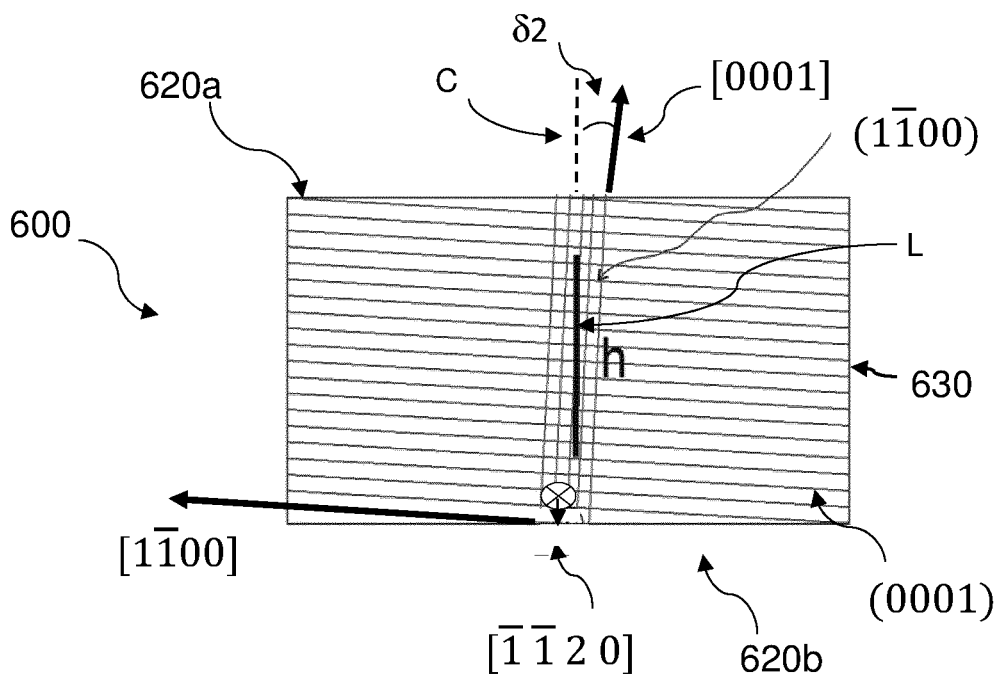
FIG. 10B is a further schematic side view (viewed in the [TT20] direction) of the semiconductor semi-finished product (or substrate) shown in FIG. 10A and depicts the inclination of the basal planes (0001) and the cleavage planes (1T00) due to the tilt by the second tilt angle δ₂.

FIGS. 10A-10B illustrate schematically a semiconductor semi-finished product 600 having a wurtzite structure and another predetermined orientation of the crystal structure for improving mechanical robustness according to a further exemplary embodiment. In this configuration, the semiconductor crystal structure has a predetermined spatial orientation with respect to the longitudinal axis C (or with respect to one or both of its front ends 620a, 620b and/or lateral surface 630) of the semiconductor semi-finished product 600 such that, in addition to an off-axis orientation of the crystallographic axis [0001] with an inclination of the respective basal plane (0001) in the direction of the crystallographic axis [$\overline{1}\overline{1}20$] by a first tilt angle $\delta_1$ (for e.g. $\delta_1=4°\pm0.5°$ as depicted in FIG. 10A), further includes a second tilt of the basal plane (0001) by a non-zero, second tilt angle $\delta_2$ in the direction of the crystallographic axis [$\overline{1}100$], as shown in FIG. 10B. In this spatial orientation, the crystallographic axes [$\overline{1}\overline{1}20$] and [$\overline{1}100$] respectively make an angle corresponding to the first and second tilt angles $\delta_1$ and $\delta_2$ with a plane transverse to the central axis C of the semiconductor semi-finished product 600, for e.g. the front face 620a, with the associated cleavage planes ($\overline{1}\overline{1}20$) and ($1\overline{1}00$) being inclined with respect to the central axis C by the angles $\delta_1$ and $\delta_2$, respectively. Thus, similarly to the embodiment of FIGS. 9A-9B, any force line segment L on the lateral surface 630 that is parallel to the central axis C will be intersected by at least a predetermined minimum number of parallel cleavage planes $N_1$ of the form $\{\overline{1}\overline{1}20\}$ and a predetermined minimum number of parallel cleavage planes $N_2$ of the form $\{10\overline{1}0\}$ per unit length of the force line segment L, depending on the position on the lateral surface 630 where the line segment L is defined, and consequently, of the position where the radial force is applied during a grinding process. Also in this case, the value of the first tilt angle $\delta_1$ and/or the second tilt angle $\delta_2$ may be estimated such as to achieve the at least predetermined minimum number of intersecting, parallel cleavage planes of the respective form per unit length of the line segment, i.e. the numbers of planes N1 and N2 at which the radial force distributed per cleavage plane becomes lower than a given cleavage threshold for the respective form of cleavage plane, taking into account the parameters of the mechanical process, and/or a known cleavage threshold for the specific type of cleavage plane. Alternatively, one or both of the first tilt angle $\delta_1$ and the second tilt angle $\delta_2$ may be determined empirically.

Both exemplary embodiments of FIGS. 9A-9B and FIGS. 10A-10B share the principle of the present invention of distributing the external mechanical force applied on the lateral surface of the semiconductor semi-finished product over a plurality of equivalent, parallel cleavage planes which are prone to cleavage, such as the lattice planes of the $\{$ $\overline{1}\overline{1}20\}$ and $\{10\overline{1}0\}$ crystallographic forms in the wurtzite structure, for reducing or even eliminating the occurrence of cracks, irrespectively of the position around the whole perimeter of the semiconductor semi-finished product where such external mechanical forces are to be applied.

A similar improvement of mechanical robustness against cleavage is also achieved in semiconductor substrates or wafers having the same spatial orientation of the semiconductor crystal structure described above with reference to FIGS. 9A-9B and FIGS. 10A-10B.

The predetermined orientation of the semiconductor crystal structure that improves mechanical robustness may be set on a semiconductor semi-finished product by the methods described below.

In raw semiconductor crystal as obtained after crystal growth and/or after a first, rough mechanical processing (pre-processed semiconductor crystal), the lattice planes and the reference surfaces (e.g. one of the processed frontal faces or cylinder surface) are not yet aligned with the required exact orientation with respect to each other, as in the final semiconductor semi-finished product.

For this reason, at the beginning of the mechanical processing, the raw semiconductor crystal (or the pre-processed semiconductor crystal) is mounted with one of its frontal faces (for instance either the side parallel to the (0001) plane or to the (000$\overline{1}$) plane in the case of a wurtzite structure) on a goniometer and/or support, and is glued or cemented thereto in order to allow a precise setting of the crystal orientation for the mechanical processing. For this orientation, commercial x-ray devices can be used and with which the orientation of the lattice planes can be exactly determined and aligned.

For example, in order to set a 4° off-axis orientation of the reference lattice plane in a crystallographic direction as shown in FIGS. 4A-4B, in a first step, the raw crystal orientation is adjusted with the goniometer in the x-ray device such that the basal plane (0001) (or (000$\overline{1}$) plane) is accurately orientated along a direction orthogonal to the future cylinder surface (i.e. with the [0001] axis aligned along the C axis), which will be defined in a subsequent mechanical processing (for example, by a grinding process).

In a subsequent step, the so orientated raw semiconductor crystal (or pre-processed semiconductor single-crystal) is tilted by the first tilt angle $\delta_1$ (e.g. 4°+/−0.5°) in the first crystallographic direction, e.g. the direction [$\overline{1}\overline{1}20$] in the wurtzite structure, using the goniometer, in order to provide the desired $\delta_1$ off-axis orientation of the basal plane for a good quality epitaxy of the future semiconductor substrates. After this positioning, the lattice planes are oriented as shown in FIG. 4A and FIG. 4B. In this case, the angle between the [0001] axis of the basal plane and the future cylinder axis C is $\delta_1=4°$ (+/−0.5°).

Thereafter, the outer diameter of the cylinder may be set to the diameter of the future substrates, for example by a grinding process. The process of diameter setting is one of the most critical steps with regard to the occurrence of cracks, as explained above. During this setting process, it is ensured that the previous goniometer-adjusted orientation of the lattice planes with respect to the cylinder surface is accurately transferred. Furthermore, the main or secondary orientation flats and/or notch can be grinded during this process step. The desired orientation of the lattice planes with respect to the cylinder surface is subsequently checked/controlled using an x-ray device, prior to any further processing.

Figure 2:
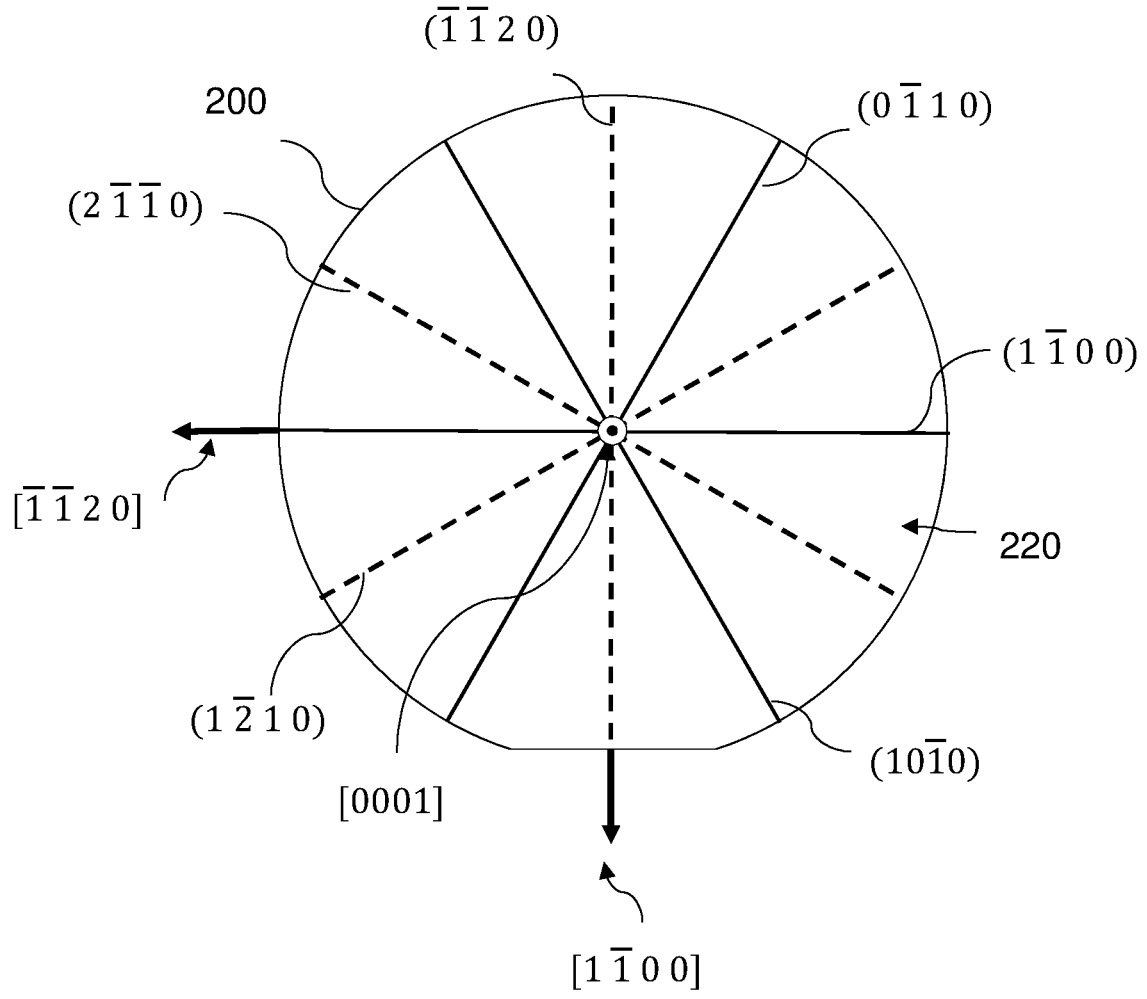
FIG. 2 is a schematic view of a conventional semiconductor semi-finished product (or substrate) with a wurtzite structure (viewed from a top, front face) and an on-axis orientation, in which the basal plane (0001) is parallel to the front face and the crystallographic direction [0001] is inclined by 0° with respect to the cylinder symmetry axis C (central axis); two sets of cleavage planes of the crystallographic forms {10$\overline{1}$0} and {11$\overline{2}$0} are depicted, the form {10$\overline{1}$0} including the (10$\overline{1}$0), (1$\overline{1}$00) and (0$\overline{1}$10) lattice planes and the form {11$\overline{2}$0} including the (2$\overline{1}\overline{1}$0), (1$\overline{2}$10) and ($\overline{1}\overline{1}$20) lattice planes.

After the processing of the outer diameter and/or orientation flats, and the control of the desired orientation of the lattice planes with respect to the cylinder surface, a process for defining the frontal faces of the semiconductor single-crystal is performed, thereby yielding the final semiconductor semi-finished product with an external shape similar to the shape illustrated in FIG. 1.

In order to set the predetermined spatial orientation of the crystal structure that improves mechanical robustness along more than on type of cleavage planes, such as the predetermined orientation depicted in FIGS. 9A-9B or FIGS. 10A-10B, the raw semiconductor crystal (or pre-processed semiconductor crystal) is submitted to a process of setting the desired predetermined orientation which includes spatially orienting the raw (or pre-processed) SiC crystal, such as by using any of the following orientation process sequences. Each step of the orientation process sequence is preferably performed using a goniometer and a commercial x-ray device to ensure a precise orientation at each step of the process sequence.

According to a first orientation process sequence for setting a predetermined orientation of the semiconductor crystal structure in a semiconductor semi-finished product 500, such as illustrated in FIGS. 9A-9B, the raw or pre-processed semiconductor crystal is spatially oriented relative to an alignment direction, which is preferably selected to be parallel to the direction of the central axis C and cylindrical lateral surface of the final semiconductor semi-finished product 500 as follows. Initially, the principal crystallographic axis of an elected reference lattice plane, i.e. the basal plane in the illustrated embodiment, may be aligned along the alignment direction such that the basal plane acquires an initial orientation that substantially makes a right angle with the alignment axis. In a subsequent step, the basal plane is tilted by a first tilt angle $\delta_1$ in the direction of a selected first crystallographic axis, which is associated to a set of parallel cleavage planes of a first crystallographic form, for e.g. the direction of the crystallographic axis [$\overline{11}20$] associated to the ($\overline{11}20$) cleavage planes in the wurtzite structure, by inclining the semiconductor crystal by the amount $\delta_1$ in the [$\overline{11}20$] direction. The set of first cleavage planes ($\overline{11}20$) becomes then inclined by the first tilt angle $\delta_1$ relative to the alignment axis while a set of second cleavage planes of a second crystallographic form, and which are transverse to the first cleavage planes ($\overline{11}20$), remain parallel to the alignment axis. In the illustrated embodiment, the set of second cleavage planes correspond to the ($1\overline{1}00$) planes and the second crystallographic direction corresponds to the [$1\overline{1}00$] direction. The so-oriented semiconductor crystal is then inclined by a second tilt angle $\delta_2$ in the direction of the second crystallographic direction associated with the second type of parallel cleavage planes, e.g. the [$1\overline{1}00$] direction of the ($1\overline{1}00$) planes in wurtzite structure, which results in the basal plane (0001) being tilted with respect to a plane transverse to the alignment axis by the second tilt angle $\delta_2$ in the [$1\overline{1}00$] direction.

According to an alternative, second orientation process sequence for setting a predetermined orientation of the semiconductor crystal structure in a semiconductor semi-finished product 600, such as illustrated in FIGS. 10A-10B, the reference lattice plane (e.g. basal plane) is also first oriented into an initial orientation that makes a right angle with the direction of a central axis C (which corresponds to the direction of the future cylindrical lateral surface 630). The basal plane is then tilted by a first tilt angle $\delta_1$ towards the first crystallographic direction (e.g. the [$\overline{11}20$] direction in FIG. 10A) from the initial orientation into a first orientation. The so oriented raw or pre-processed semiconductor crystal is then inclined by a second tilt angle $\delta_2$ towards the second crystallographic direction (e.g. [$\overline{1}100$] direction in FIG. 10B), such that the basal plane (0001) is tilted with respect to a plane transverse to the alignment axis by the additional tilt angle $\delta_2$ in the [$\overline{1}100$] direction.

In the first and second orientation process sequences described above, the value of the first tilt angle is preferably $4°\pm0.5°$ for a SiC semiconductor material, where the error of $\pm0.5°$ is associated with an acceptable tolerance in the value of the first tilt angle that still allows obtaining the desired improvement in the epitaxy properties of the respective semiconductor substrates. The value of the second tilt angle $\delta_2$ is preferably 0.023°. However, any value within the range of [0.015°;0.153°] may be used for the second tilt angle $\delta_2$, at which the desired effect of orientation onto the mechanical robustness can be achieved. In particular, as mentioned above, the values of the first and/or second tilt angles may be estimated based on the distance between the equivalent, parallel cleavages planes of the respective form and whose cleavage effect is intended to be minimized, and by reference to the at least predetermined minimum number of intersecting cleavage planes per unit length of a force line segment that yields an applied force per plane below a critical cleavage threshold described above.

In the case of an AlN semiconductor material, the values of both the first and second tilt angles may be set to a smaller angle, for e.g. 0.042°.

According to a third orientation process sequence for setting a further predetermined orientation that improves mechanical robustness, the reference lattice plane (e.g. basal plane) is first aligned to a initial orientation that makes a right angle with respect to the direction of the central axis C, i.e. the direction of the future cylindrical lateral surface. The basal plane is then rotated about this initial direction by a predetermined rotation angle in a clockwise direction. The predetermined rotation angle is preferably 0.33°, but any a value within the range [0.22°; 2.19°] may be used. In a subsequent step, the basal plane is further tilted by a tilt angle $\delta_3$ in the first crystallographic direction, e.g. the [$\overline{11}20$] direction of the wurtzite structure. The tilt angle $\delta_3$ is preferably equal to 4° (with a tolerance of $\pm0.5°$) for a SiC semiconductor. However, other values for the tilt angle $\delta_3$ may be used depending on the type of semiconductor material, the underlying crystal structure, and/or the off-orientation that provides best epitaxy results to the final substrates.

Alternatively, a fourth orientation process sequence may be used, in which the reference lattice plane (e.g. basal plane) is also first aligned to a initial orientation that makes a right angle with respect to the direction of the central axis C, i.e. the direction of the future cylindrical lateral surface. The basal plane is then rotated about this initial direction by a predetermined rotation angle in a counter-clockwise direction. The predetermined rotation angle is preferably 0.33° but it may be any value within the range [0.22°; 2.19°] for obtaining the desired effect of orientation onto the mechanical robustness. In a subsequent step, the basal plane is further tilted by a given tilt angle $\delta_3$ in the [$\overline{11}20$] direction of the semiconductor crystal structure. Similarly to the third orientation process, the value of the tilt angle $\delta_3$ depends on the type of semiconductor material, the underlying crystal structure, and/or the off-orientation that provides best epitaxy results.

After the crystallographic directions of the raw semiconductor crystal (or pre-processed semiconductor crystal) have been aligned by any of the orientation process sequences described above, one or more external reference surfaces of the final 4H-Si semi-finished product may be machined with reference to the alignment axis C. For instance, a at least partially curved lateral surface may be machined on the oriented raw or pre-processed semiconductor crystal in a direction parallel to the alignment axis C. In addition, or alternatively, one or two front faces of the final 4H-Si semi-finished product may be machined in a direction orthogonal to the C axis.

Thus, the predetermined orientation of the reference lattice plane, such as the basal plane (0001), and other lattice planes of the semiconductor structure can be accurately set with respect to at least one reference surface of the semiconductor semi-finished product, i.e. the curved lateral surface and/or one or both of its front faces.

The diameter of the curved lateral surface may be set to substantially correspond to an intended diameter of the substrate wafers to be sliced from the semiconductor semi-finished product. In particular, the technique of the present invention may be applied to improve mechanical robustness of semiconductor semi-finished products, and semiconductor substrates obtained therefrom.

Furthermore, the technique of the present invention may be applied to improve mechanical robustness of semiconductor semi-finished products or raw semiconductor crystals of any height that is previously selected to yield a desired number of semiconductor substrate slices.

As mentioned above, semiconductor semi-finished products and/or substrates are available with either the on-axis or the off-axis orientation depending on the type of semiconductor material and application. In the case of semiconductor materials with a wurtzite structure and an on-axis orientation, since the reference lattice plane is orthogonal to the central axis C, all the cleavage planes transverse to the reference lattice plane intersect the lateral surface of the semiconductor semi-finished product or substrate at a right angle. In this case, all the cleavage planes illustrated in FIG. 2 become critical in terms of cleavage. In order to improve mechanical robustness against cleavage, the predetermined orientation of the crystal structure may be set in a as-grown semiconductor crystal or semiconductor substrate having an on-axis orientation by spatially orienting the semiconductor crystal structure such that the reference lattice plane is sequentially inclined in two different crystallographic directions associated with two different forms of preferred cleavage planes, for e.g. in directions orthogonal to each other, by predetermined tilt angles that allow minimizing cleavage. The respective cleavage planes become then inclined with respect to a segment line along the lateral surface the semiconductor crystal or substrate and satisfy the condition of an external radial force applied along the line segment being distributed over at least a minimum number of parallel cleavage planes per unit length. In the case of the AlN semiconductor material with wurtzite structure, the condition for obtaining at least a minimum of 1.000 parallel cleavage planes per unit length that intersect the cylinder lateral surface for each form of cleavage plane may be achieved by the following spatial orientation process.

In a first step, the basal plane (reference lattice plane) may be first oriented to become orthogonal to an alignment axis (which corresponds to the central axis C of the final semi-finished product or substrate). The basal plane may then be tilted by a first tilt angle $\delta_1$ of 0.042° in the direction $[\bar{1}\bar{1}20]$, followed by a second tilt by a tilt angle $\delta_2$ of 0.042° in the $[1\bar{1}00]$ direction or in the $[\bar{1}100]$ direction.

Nevertheless, the principles of the present invention may be applicable to semi-finished products and/or substrates made from other semiconductors materials and/or having crystal structures other than those described above for improving robustness along the direction of the critical cleavage planes, such as to any of the semiconductor materials listed in Table 1 below.

TABLE 1

Examples of semiconductor materials with wurtzite, diamond or zincblende structure; the angle θ corresponds to the angle between the indicated cleavage plane and the reference lattice plane, which coincides with the substrate surface of a semiconductor substrate with on-axis orientation.

| Semiconductor Type | Material | Crystal Structure | Critical Cleavage Planes | Reference lattice plane | θ° |
|---|---|---|---|---|---|
| III-V semiconductor wide gap | SiC, AlN, GaN | Wurtzite | {10$\bar{1}$0} {11$\bar{2}$0} | {0001} | 90° |
| III-V semiconductor | InN | | | | |
| Silicon | Si | Diamond | {111} | {110} | 90° |
| III-V semiconductor | GaAs, GaN, BP, BAs, AlP, GaP, AlAs, InP, InAs, GaSb, AlSb, InSb | Zincblende | {110} | {100} {110} {111} | 90° |
| II-VI semiconductor | CdS, ZnS, ZnSe, ZnTe, HgTe, CdTe | | | | |
| II-VI-Mixed crystal | (Zn,Cd)Se, Zn(S,Se), (Be,Zn)Se, (Be,Cd)Se | | | | |

The semiconductor semi-finished product set with the predetermined orientation of the semiconductor lattice for improving mechanical robustness can be subsequently divided into substrate wafers using commonly known wafer separation processes, like multi-wire sawing with diamond-based slurry, wire-based spark corrosion, or other alternative separation processes. This predetermined orientation of the semiconductor lattice may be transferred into the substrate wafer by referring to any of the reference surfaces of the semiconductor semi-finished product during the separation process.

Figure 11:
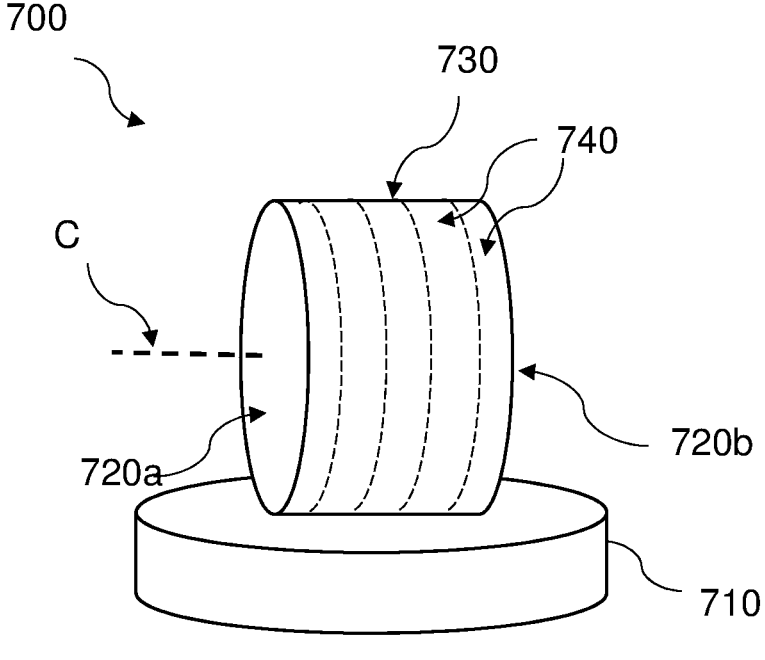
FIG. 11 shows schematically a support configuration of a monocrystalline semiconductor semi-finished product for transferring the pre-set crystal orientation from the semiconductor semi-finished product to individual semiconductor wafers, during a wafer separation process, by reference to the cylindrical lateral surface of the semiconductor semi-finished product, according to an embodiment.
Figure 12:
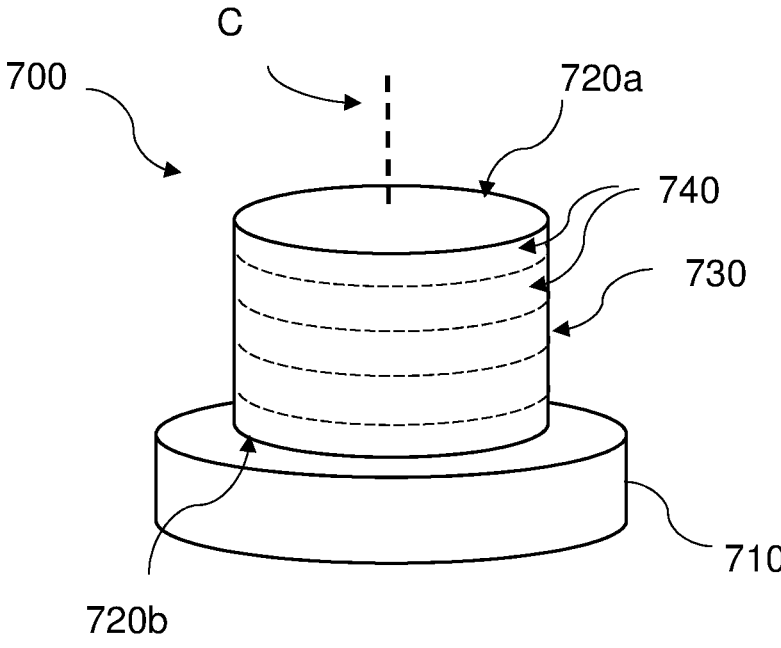
FIG. 12 shows schematically a further support configuration of a monocrystalline semiconductor semi-finished product for transferring the pre-set crystal orientation from the semiconductor semi-finished product to individual semiconductor wafers, during a wafer separation process, by reference to one of the frontal faces of the semiconductor semi-finished product, according to an embodiment.

Alternative exemplary embodiments for supporting the semiconductor semi-finished product during a wafer separation process and transfer the predetermined orientation of the underlying semiconductor lattice into the semiconductor substrates are illustrated in FIGS. 11 and 12.

FIG. 11 illustrates a configuration in which the transfer of the crystal orientation of a monocrystalline semiconductor semi-finished product 700, such as any of the monocrystalline semiconductor semi-finished products 500 and 600 described above, to a semiconductor substrate 740 is performed via the cylinder lateral surface 730. In the case of separation processes in which the support of the single-crystal semiconductor semi-finished product 700 to be processed is implemented via support of the cylinder lateral surface 730, the cylinder lateral surface 730 requires an exact alignment with respect to the orientation of the semiconductor lattice planes. In this separation method, the orientation of the lattice planes is thus transferred through their respective alignment with respect to the cylinder lateral surfaces 730.

FIG. 12 illustrates a configuration in which the monocrystalline semiconductor semi-finished product 700 is supported on one of the front faces 720b. In the case of separation processes in which the support of the single-crystal semiconductor semi-finished product to be processed is implemented via support of the front faces, the front faces require an exact alignment with respect to the orientation of the lattice planes. In these separation methods, the orientation of the semiconductor lattice planes is transferred through the alignment of one of the cylinder frontal faces 720b with respect to the lattice planes. In this case, the orientation of the lattice planes with respect to the frontal face 720b intended for the support is preferably measured using X-radiographic methods, set using a goniometer, and precisely transferred during the mechanical processing, for example using a grinding process. For a precise transfer of the predetermined orientation of the semiconductor lattice planes into the substrate wafers 740, one of the following basic conditions should be satisfied by the monocrystalline semiconductor semi-finished product 700:

at least one of both frontal faces 720a and/or 720b (reference surface) is oriented at a right angle with respect to the cylindrical lateral surface 730, i.e. the lattice orientation is precisely transferred through one of the reference surfaces;

both frontal faces 720a and 720b (reference surface) are oriented at a right angle with respect to the cylindrical lateral surface 730, i.e. the lattice orientation can be precisely transferred through both reference surfaces.

Figure 13A:
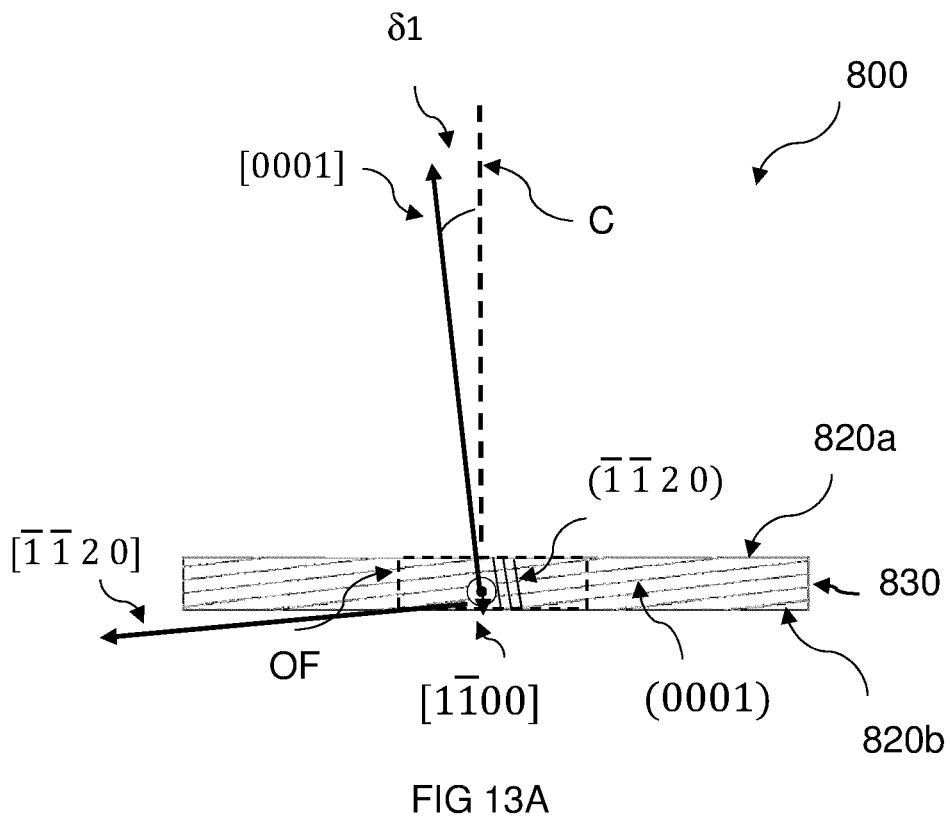
FIG. 13A is a schematic side view (viewed from the [1T00] direction side) of a semiconductor substrate with a wurtzite structure and a predetermined crystallographic orientation for improving mechanical robustness according to an exemplary embodiment and which is similar to the predetermined crystallographic orientation of the semiconductor semi-finished product depicted in FIGS. 9A-9B.
Figure 13B:
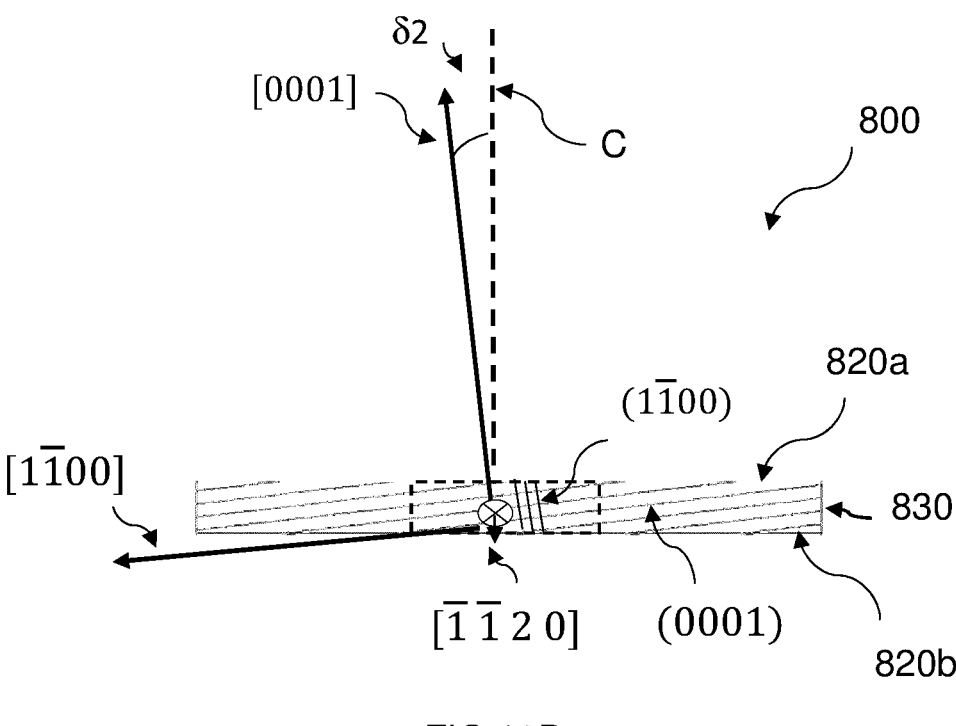
FIG. 13B is a further schematic side view of the semiconductor substrate shown in FIG. 13A and depicts the inclination of the basal planes (0001) and the cleavage planes (1T00) due to the tilt by the second tilt angle δ₂ (viewed in the [TT20] direction).

FIGS. 13A and 13B depict a finished semiconductor substrate 800 with a set predetermined semiconductor crystallographic orientation for improving the substrate mechanical robustness against cleavage as obtained from a semiconductor semi-finished product set with the predetermined orientation described with reference to the semiconductor semi-finished product 500 of FIGS. 9A-9B and after using any of the separation processes described above.

In case the raw substrates semiconductor 740 are produced from a monocrystalline semiconductor semi-finished product 700 that has already been set with the desired predetermined orientation, such as the semiconductor crystal semi-finished products 500 and 600 described above with reference to FIGS. 9A-9B and 10A-10B, the predetermined orientation of the semiconductor crystal lattice has already been set with respect to at least one reference surface of the semiconductor semi-finished product 700, for e.g. the lateral cylindrical surface 730 and/or one or both of the front faces 720a and 720b. This relative orientation of the semiconductor crystal lattice is then transferred to the raw semiconductor substrate 740 during slicing of the semiconductor semi-finished product 700 by using one of these reference surfaces, as illustrated in FIGS. 11 and 12. For instance, in the configuration shown in FIG. 11, the reference surface for transferring the crystallographic orientation is the lateral surface 730 of the semiconductor semi-finished product 700. In the configuration shown in FIG. 12, one of the front faces 720a and 720b of the semiconductor semi-finished product 700 is used as the reference surface.

After slicing, the crystallographic orientation in the raw semiconductor substrates 740 may be then determined using a goniometer and X-ray measurements to determine if the desired orientation according to the principles of the present invention has been accurately transferred. In case deviations from the desired orientation are identified, the process of setting the predetermined orientation of the semiconductor crystal structure in the semiconductor substrate 800 may then include applying a planarization process with pre-alignment to the raw semiconductor substrates 740 for correcting the orientation of the semiconductor crystal lattice with respect to the semiconductor substrate front face(s) and/or lateral surfaces.

In conclusion, the present invention allows reducing the occurrence of fissures during mechanical processing of semiconductor single-crystals and/or semiconductor substrates by setting an optimal orientation of preferred cleavage planes with respect to lateral surfaces and/or one or both front faces of the semiconductor semi-finished product or semiconductor substrates such that the radial mechanical force applied on a given area during mechanical processing is always distributed over at least a predetermined minimum number of the preferred cleavage planes, irrespectively from the position on the perimeter of the semiconductor semi-finished product or semiconductor substrate where the mechanical force is being applied.

Consequently, via this optimal orientation of the semiconductor crystal structure, a higher mechanical robustness during mechanical processing of bulk semiconductor crystals and semiconductor substrates can be achieved, and therefore, a higher yield of the monocrystalline semi-finished and end products, without reducing the epitaxy qualities of the future substrates and without a significant increase in costs and/or time of the respective mechanical processes.

Although certain features of the above exemplary embodiments were described using terms such as "downwards", "top", "bottom" and "vertical", these terms are used for the purpose of facilitating the description of the respective features and their relative orientation within the semiconductor single-crystals and/or semiconductor substrates only and should not be construed as limiting the claimed invention or any of its components to a particular spatial orientation.

REFERENCE SIGNS

C geometrical, longitudinal axis
L line segment
h height of a grinding wheel, length of line segment L
100 AlN semi-finished product
110 orientation flat (OF)
120a, 120b upper and lower front faces of cylinder
130 lateral cylindrical surface
200 AlN semi-finished product with on-axis orientation (prior art)
220 front face
230 cylindrical, lateral surface
240 grinding wheel
300 AlN substrate with 4°-off orientation (prior art)
320a, 320b upper and lower front faces of cylinder
330 cylindrical, lateral surface
400 AlN semi-finished product with 4°-off orientation (prior art)
420a, 420b upper and lower front faces of cylinder
430 cylindrical, lateral surface
500 AlN semi-finished product
520a, 520b upper and lower front faces of cylinder
530 cylindrical, lateral surface
600 AlN semi-finished product
620a, 620b upper and lower front faces of cylinder
630 cylindrical, lateral surface
700 mono-crystalline semiconductor semi-finished product
710 support
720a, 720b, and 730 frontal faces and lateral surface
740 substrate wafers
800 finished semiconductor substrate
820a, 820b upper and lower front faces of substrate
830 cylindrical, lateral surface of substrate

The invention claimed is:

1. A monocrystalline semiconductor semi-finished product or monocrystalline semiconductor substrate of improved mechanical robustness against cleavage, the semiconductor semi-finished product or substrate having a central axis and a at least partially curved lateral surface parallel to said central axis, further comprising:

first and second front faces, wherein the first front face is perpendicular to the central axis, and said central axis is an axis of symmetry of a cylindrical surface defined by a curved part of said at least partially curved lateral surface, characterized in that a crystal structure of the monocrystalline semiconductor is a diamond structure, said crystal structure being oriented relative to the central axis and the at least partially curved lateral surface of the semiconductor semi-finished product or substrate with a predetermined orientation at which:

a first crystallographic axis, which is a crystallographic axis perpendicular to a set of first cleavage planes of the {111} family, makes a first tilt angle with a plane transverse to the central axis;

a second crystallographic axis, which is a crystallographic axis perpendicular to a set of second cleavage planes and to the first crystallographic axis, makes a second tilt angle with said plane transverse to the central axis so that each set of parallel cleavage planes that are symmetrically equivalent to either the first cleavage planes or to the second cleavage planes are inclined relative to the central axis by respective tilt angles; and a reference lattice plane of the crystal structure, which is a plane of the {110} family that makes an angle of 90° with the first cleavages planes, is inclined with respect to the first front face by the first tilt angle in the direction of the first crystallographic axis and by the second tilt angle in the direction of the second crystallographic axis;

wherein the first crystallographic axis is the [111] axis or any of the crystallographic axes symmetrically equivalent to the [111] axis in the diamond structure, wherein the first tilt angle and the second tilt angle are selected such that each set of first cleavage planes and each set of second cleavage planes of said crystal structure intersects the at least partially curved lateral surface along a line segment, which is parallel to the central axis, with at least a predetermined minimum number of parallel cleavage planes per unit length of the line segment, respectively, irrespective to a position of the line segment around an outer perimeter of the semiconductor semi-finished product or substrate, and wherein said predetermined minimum number of parallel cleavage planes per unit length is at least 1000 planes per millimeter.

2. The monocrystalline semiconductor semi-finished product or substrate of claim 1, wherein the selected first tilt angle is an estimated value based on an atomic distance between adjacent, first cleavage planes and on a radial force to actuate along said line segment during mechanical processing of the semiconductor semi-finished product or substrate, so as to yield a number of parallel, first cleavage planes intersecting the line segment per unit length at which the radial force per first cleavage plane is lower than a given cleavage threshold for the first cleavage planes; and/or the selected second tilt angle is an estimated value based on an atomic distance between adjacent, second cleavage planes and on a radial force to actuate along said line segment during mechanical processing of the semiconductor semi-finished product or substrate, so as to yield a number of parallel, second cleavage planes intersecting the line segment per unit length at which the radial force per second cleavage plane is lower than a given cleavage threshold for the second cleavage planes.

3. The monocrystalline semiconductor semi-finished product or substrate of claim 1, wherein the first and second front faces are respectively perpendicular to the at least partially curved lateral surface, and/or the second front face is perpendicular to the central axis; and/or the monocrystalline semiconductor is silicon.

4. A method of producing the monocrystalline semiconductor semi-finished product or monocrystalline semiconductor substrate according to claim 1, the method comprising:

performing a process of setting the predetermined orientation of the crystal structure relative to the central axis and the at least partially curved lateral surface to the predetermined orientation at which:

the first crystallographic axis perpendicular to the set of first cleavage planes makes the first tilt angle with the plane transverse to the central axis, and the second crystallographic axis perpendicular to the set of second cleavage planes and to the first crystallographic axis makes the second tilt angle with said plane transverse to the central axis so that each set of parallel cleavage planes that are symmetrically equivalent to either the first cleavage planes or to the second cleavage planes are inclined relative to the central axis by respective tilt angles;

wherein the first tilt angle and the second tilt angle are selected such that each set of first cleavage planes and each set of second cleavage planes of said crystal structure intersects said at least partially curved lateral surface along the line segment, which is parallel to the central axis, with at least the predetermined minimum number of parallel cleavage planes per unit length of the line segment, respectively, and irrespective to the position of the line segment around the outer perimeter of the semiconductor semi-finished product or substrate, and wherein said predetermined minimum number of parallel cleavage planes per unit length is at least 1000 planes per millimeter.

5. The method of claim 4, wherein the monocrystalline semiconductor is silicon.

6. The method of claim 4, further comprising:

estimating said first tilt angle based on an atomic distance between the first cleavage planes normal to the first crystallographic axis, and/or estimating said second tilt angle based on an atomic distance between the second cleavage planes normal to the second crystallographic axis so as to yield said at least predetermined minimum number of parallel cleavage planes per unit length.

7. The method of claim 4, wherein the process of setting said predetermined orientation of the crystal structure with respect to said central axis of the semiconductor semi-finished product includes:

spatially orienting the crystal structure with respect to an alignment axis such as to achieve said predetermined orientation of the crystal structure with respect to a plane transverse to said alignment axis; and machining an external surface of the spatially oriented crystal structure with reference to said alignment axis to form at least one of:

the at least partially curved lateral surface that is substantially parallel to said alignment axis, and at least one of the first and second front face surfaces is substantially orthogonal to the alignment axis;

wherein the alignment axis of the spatially oriented crystal structure is selected to be parallel to the central axis of the semiconductor semi-finished product.

8. The method of claim 7, wherein the process of spatially orienting the crystal structure with respect to the alignment axis includes:

aligning a principal crystallographic axis of the reference lattice plane along an alignment direction, the reference lattice plane being transverse to the sets of first and second cleavage planes, and tilting the reference lattice plane in a first direction by the first tilt angle, the first direction corresponding to the first crystallographic axis normal to the set of first cleavage planes, so that the set of first cleavage planes becomes inclined by the first tilt angle relative to the alignment axis and the set of second cleavage planes remains parallel to the alignment axis.

9. The method of claim 7, wherein the process of spatially orienting the crystal structure with the predetermined orientation respect to the alignment axis further includes:

tilting the reference lattice plane in a second direction by the second tilt angle, the second direction corresponding to the second crystallographic axis, so that the set of second cleavage planes becomes inclined by the second tilt angle relative to the alignment axis.

10. The method of claim 8, wherein the process of spatially orienting the crystal structure with respect to the alignment axis includes:

aligning the principal crystallographic axis of the reference lattice plane along the alignment direction, the reference lattice plane being transverse to the set of first cleavage planes;

rotating the reference lattice plane about said alignment direction by a predetermined rotation angle in a clockwise direction or a counter-clockwise direction; and tilting the rotated reference lattice plane by the first tilt angle in the first direction, the first direction corresponding to the first crystallographic axis of said set of first cleavage planes.

\* \* \* \* \*